(12) United States Patent
Bo et al.

(10) Patent No.: US 12,067,190 B1
(45) Date of Patent: Aug. 20, 2024

(54) TOUCH LAYER ASSEMBLY AND TOUCH DISPLAY APPARATUS

(71) Applicant: BOE TECHNOLOGY GROUP CO., LTD., Beijing (CN)

(72) Inventors: Zewen Bo, Beijing (CN); Xuefei Sun, Beijing (CN); Yuanyuan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/778,470

(22) PCT Filed: Jun. 4, 2021

(86) PCT No.: PCT/CN2021/098333
§ 371 (c)(1),
(2) Date: May 20, 2022

(87) PCT Pub. No.: WO2022/252215
PCT Pub. Date: Dec. 8, 2022

(51) Int. Cl.
*G06F 3/041* (2006.01)
*G06F 3/044* (2006.01)
(Continued)

(52) U.S. Cl.
CPC ........ *G06F 3/04164* (2019.05); *G06F 3/0412* (2013.01); *G06F 3/044* (2013.01);
(Continued)

(58) Field of Classification Search
CPC .... G06F 3/04164; G06F 3/0412; G06F 3/044; G06F 2203/04111; G06F 2203/04112;
(Continued)

(56) References Cited

U.S. PATENT DOCUMENTS

| | | | | |
|---|---|---|---|---|
| 2012/0299865 A1* | 11/2012 | Yu | .......... | G06F 3/0446 345/174 |
| 2015/0227237 A1* | 8/2015 | Ono | ...... | G06F 3/0445 345/174 |

(Continued)

FOREIGN PATENT DOCUMENTS

| | | |
|---|---|---|
| CN | 107301001 | 10/2017 |
| CN | 109213369 | 1/2019 |

(Continued)

*Primary Examiner* — Ryan A Lubit
(74) *Attorney, Agent, or Firm* — Dority & Manning, P.A.

(57) ABSTRACT

A touch layer assembly includes a substrate layer and effective touch lines and sensing electrodes that are disposed thereon. A sensing electrode is coupled to at least one effective touch line; the sensing electrode includes sensing main lines, each of at least one sensing main line is composed of first sensing line segments and second sensing line segments that are alternately connected; at least one sensing electrode further includes third sensing line segments connected to a sensing main line; the sensing electrodes include a first sensing electrode and a second sensing electrode that are adjacent in the first direction, and in the first sensing electrode and the second sensing electrode, a disconnected point where two sensing main lines adjacent in a same extension direction are disconnected is located on a second sensing line segment at an end of a sensing main line of the two sensing main lines.

20 Claims, 13 Drawing Sheets

(51) Int. Cl.
*H10K 59/40* (2023.01)
*G02F 1/1333* (2006.01)
*H10K 59/122* (2023.01)

(52) U.S. Cl.
CPC ......... *H10K 59/40* (2023.02); *G02F 1/13338* (2013.01); *G06F 2203/04111* (2013.01); *G06F 2203/04112* (2013.01); *H10K 59/122* (2023.02)

(58) Field of Classification Search
CPC ... G02F 1/13338; H10K 59/40; H10K 59/122
See application file for complete search history.

(56) References Cited

U.S. PATENT DOCUMENTS

| | | | | |
|---|---|---|---|---|
| 2015/0331538 | A1* | 11/2015 | Hashida | G06F 3/0446 345/174 |
| 2016/0109977 | A1* | 4/2016 | Hashimoto | G06F 3/0443 345/174 |
| 2017/0177124 | A1* | 6/2017 | Konoshita | G06F 3/0448 |
| 2017/0269728 | A1* | 9/2017 | Donnelly | G06F 3/0443 |
| 2017/0351132 | A1* | 12/2017 | Kanari | G06F 3/0416 |
| 2018/0113347 | A1* | 4/2018 | Hara | G06F 3/0445 |
| 2019/0121469 | A1* | 4/2019 | Takizawa | B32B 7/12 |
| 2019/0129568 | A1* | 5/2019 | Sakamoto | G06F 3/0446 |
| 2019/0204953 | A1 | 7/2019 | Min et al. | |
| 2019/0294274 | A1 | 9/2019 | Cho et al. | |
| 2020/0033978 | A1* | 1/2020 | Xiang | G06F 3/0443 |
| 2020/0042116 | A1 | 2/2020 | Li | |
| 2022/0045418 | A1* | 2/2022 | Nakamura | H01Q 1/36 |

FOREIGN PATENT DOCUMENTS

| | | |
|---|---|---|
| CN | 109445646 | 3/2019 |
| CN | 109542273 | 3/2019 |
| CN | 111124189 | 5/2020 |
| CN | 111427475 | 7/2020 |

* cited by examiner

TOUCH LAYER ASSEMBLY AND TOUCH DISPLAY APPARATUS

CROSS-REFERENCE TO RELATED APPLICATION

This application is a national phase entry under 35 USC 371 of International Patent Application No. PCT/CN2021/098333, filed on Jun. 4, 2021, which is incorporated herein by reference in its entirety.

TECHNICAL FIELD

The present disclosure relates to the field of display technologies, and in particular, to a touch layer assembly and a touch display apparatus.

BACKGROUND

Since rise of touch technologies, due to their characteristics of simplicity, rapidness, humanization, and the like, the touch technologies have become more and more popular, and there are more and more products with a touch function in the market, such as mobile phones, tablet computers and notebook computers.

At present, the touch technologies include a mutual capacitance touch technology and a self-capacitance touch technology. With increase of display sizes, disadvantages of products adopting the mutual capacitance touch technology, such as high capacitive loads on touch electrodes, serious noise received by the touch electrodes and great attenuation of remote signals, gradually emerge. Compared with the mutual capacitance touch technology, products adopting the self-capacitance touch technology have obvious advantages in performance such as capacitive load, touch report rate and signal-to-noise ratio, and thus the self-capacitance touch technology has received more and more attention.

SUMMARY

In an aspect, a touch layer assembly is provided. The touch layer assembly includes a substrate layer, a plurality of effective touch lines disposed on the substrate layer, and a plurality of sensing electrodes disposed on the substrate layer. At least one effective touch line extends along a first direction, the plurality of effective touch lines are arranged in a second direction intersecting the first direction; a sensing electrode is coupled to at least one effective touch line; the sensing electrode includes a plurality of sensing main lines arranged in the second direction; at least one sensing main line extends along the first direction, and each of at least one sensing main line is composed of a plurality of first sensing line segments and a plurality of second sensing line segments that are alternately connected; at least one first sensing line segment extends along the first direction, and at least one second sensing line segment is oblique relative to the first direction; the sensing electrode further includes a plurality of third sensing line segments connected to a sensing main line; at least one third sensing line segment is oblique relative to the first direction, and the at least one third sensing line segment has a free line end; the plurality of sensing electrodes include a first sensing electrode and a second sensing electrode that are adjacent in the first direction, and in the first sensing electrode and the second sensing electrode, a disconnected point where two sensing main lines arranged adjacent in a same extension direction are disconnected is located on a second sensing line segment at an end of a sensing main line of the two sensing main lines.

In some embodiments, the at least one third sensing line segment extends in a same direction as a second sensing line segment; the at least one effective touch line includes at least one coupling portion, and each coupling portion is electrically connected to the sensing electrode; an orthographic projection, on the substrate layer, of a portion of each effective touch line of the at least one effective touch line other than at least one coupling portion included in the effective touch line is not overlapped with an orthographic projection, on the substrate layer, of the sensing electrode.

In some embodiments, the plurality of second sensing line segments include a plurality of first oblique line segments and a plurality of second oblique line segments; an angle from the first direction clockwise to an extension direction of a first oblique line segment is an acute angle, and an angle from the first direction clockwise to an extension direction of a second oblique line segment is an obtuse angle; in a plurality of disconnected points where the first sensing electrode and the second sensing electrode are disconnected, a part of the disconnected points are located on first oblique line segments in the first sensing electrode and the second sensing electrode, and a remaining part of the disconnected points are located on second oblique line segments in the first sensing electrode and the second sensing electrode.

In some embodiments, in the second direction, the plurality of disconnected points where the first sensing electrode and the second sensing electrode are disconnected are alternately distributed on the first oblique line segments and the second oblique line segments.

In some embodiments, the plurality of sensing electrodes further include a third sensing electrode adjacent to the first sensing electrode in the second direction; an edge sensing main line at a border between the first sensing electrode and the third sensing electrode is provided with at least one disconnected point, and the at least one disconnected point divides the edge sensing main line into a plurality of disconnected lines; and at least one disconnected line in the plurality of disconnected lines that is not connected to the first sensing electrode is connected to the third sensing electrode.

In some embodiments, the at least one disconnected point of the edge sensing main line is located on second sensing line segment(s) of the edge sensing main line.

In some embodiments, an extension direction of an upper edge of a disconnected surface at the disconnected point of the second sensing line segment is perpendicular to an extension direction of the second sensing line segment, and the upper edge is an edge, away from the substrate layer, of edges of the disconnected surface.

In some embodiments, the sensing electrode and the at least one effective touch line coupled to the sensing electrode are arranged in different layers; the touch layer assembly further includes an insulating layer disposed between the sensing electrode and the effective touch line; and the coupling portion is coupled to the sensing electrode through at least one via hole in the insulating layer.

In some embodiments, the sensing electrode and the at least one effective touch line coupled to the sensing electrode are arranged in a same layer; the coupling portion is coupled to the sensing electrode through a bridge, and an insulating layer is provided between the bridge and the sensing electrode.

In some embodiments, in the sensing electrode, two adjacent sensing main lines are connected through at least one connection portion, and a connection portion is composed of at least two third sensing line segments that are connected.

In some embodiments, a plurality of connection portions in two adjacent columns are staggered in the second direction, and a direction in which a column of the connection portions are arranged is the first direction.

In some embodiments, at least two connection portions are disposed between two adjacent sensing main lines that are arranged in the second direction; and at least four first sensing line segments are disposed between two adjacent connection portions in the at least two connection portions.

In some embodiments, the touch layer assembly further includes a plurality of dummy touch lines disposed in a same layer as the plurality of effective touch lines. At least one dummy touch line extends along the first direction, the at least one dummy touch line is arranged in the second direction, and a shape of a dummy touch line and a shape of an effective touch line are substantially same; and effective touch line(s) and dummy touch line(s) that correspond to the sensing electrode are spaced apart in the second direction.

In some embodiments, the at least one sensing electrode has a first region, and effective touch lines passing through the first region and sensing main lines located in the first region are alternately arranged in the second direction; the at least one sensing electrode further has two second regions, and at least one dummy touch line passing through a second region and sensing main lines located in the second region are alternately arranged in the second direction; and the two second regions are located on two sides of the first region in the second direction.

In some embodiments, the dummy touch line includes at least one dummy touch line segment; and a dummy touch line segment is coupled to a sensing electrode.

In some embodiments, each of the at least one dummy touch line is composed of a plurality of first touch line segments and a plurality of second touch line segments that are alternately connected; at least one first touch line segment extends along the first direction, and at least one second touch line segment is oblique relative to the first direction; the plurality of second touch line segments include a plurality of third oblique line segments and a plurality of fourth oblique line segments; the plurality of third oblique line segments and the plurality of four oblique line segments are alternately arranged in the first direction; a third oblique line segment extends in a same direction as the first oblique line segment; a fourth oblique line segment extends in a same direction as the second oblique line segment; in the first sensing electrode and the second sensing electrode, in a plurality of disconnected points where two dummy touch line segments adjacent in a same direction are disconnected, a part of the disconnected points are located on third oblique line segments, and a remaining part of the disconnected points are located on fourth oblique line segments.

In some embodiments, in the second direction, the plurality of disconnected points where the plurality of dummy touch line segments are disconnected are alternately located on the third oblique line segments and the fourth oblique line segments.

In some embodiments, an extension direction of an upper edge of a disconnected surface at a disconnected point of a second touch line segment is perpendicular to an extension direction of the second touch line segment, and the upper edge is an edge, away from the substrate layer, of edges of the disconnected surface.

In some embodiments, the touch layer assembly further includes at least one fourth sensing line segment. A fourth sensing line segment is perpendicular to a first sensing line segment connected thereto.

In another aspect, a touch display apparatus is provided. The touch display apparatus includes the touch layer assembly as described in any one of the above embodiments.

In some embodiments, the touch display apparatus has a display region; the display region includes a plurality of sub-pixel regions and a pixel defining region for defining the plurality of sub-pixel regions; and the effective touch lines and the sensing electrodes are located in the pixel defining region.

In some embodiments, two sensing main lines adjacent in the second direction are separated by m sub-pixel regions, m is greater than or equal to 1 (m≥1), and m is a positive integer.

In some embodiments, the touch display apparatus is a self-luminescent display apparatus; the self-luminescent display apparatus includes a display substrate; and the substrate layer in the touch layer assembly servers as an encapsulation layer for encapsulating the display substrate.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
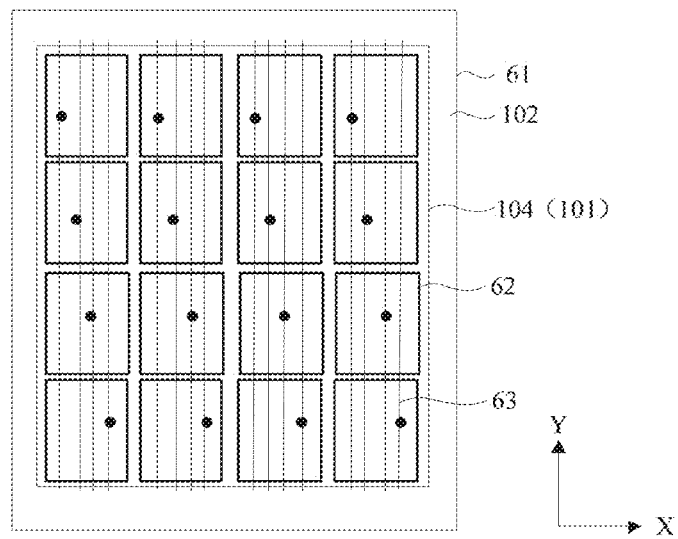
FIG. 1 is a diagram showing a structure of a touch display apparatus, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive sense, i.e., "including, but not limited to". In the description, the term such as "one embodiment", "some embodiments", "exemplary embodiments", "example", "specific example" or "some examples" is intended to indicate that specific features, structures, materials or characteristics related to the embodiment(s) or example(s) are included in at least one embodiment or example of the present disclosure. Schematic representation of the above term does not necessarily refer to the same embodiment(s) or examples(s). In addition, the specific features, structures, materials, or characteristics may be included in any one or more embodiments or examples in any suitable manner.

Hereinafter, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if", depending on the context, is optionally construed as "when" or "in a case where" or "in response to determining" or "in response to detecting". Similarly, depending on the context, the phrase "if it is determined" or "if [a stated condition or event] is detected" is optionally construed as "in a case where it is determined" or "in response to determining" or "in a case where [the stated condition or event] is detected" or "in response to detecting [the stated condition or event]".

The use of the phrase "applicable to" or "configured to" herein means an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The terms such as "about", "substantially" or "approximately" as used herein includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the accompanying drawings, thickness of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a touch display apparatus with both a touch function and an image display function. The touch display apparatus may be, but is not limited to, a mobile phone, a tablet computer, and a personal digital assistant (PDA), or an in-vehicle computer. The embodiments of the present disclosure do not limit use of the touch display apparatus.

The touch display apparatus includes a touch layer assembly and a display panel.

In application of self-capacitive touch technology, a plurality of layer structures for realizing touch sensing may be stacked to form the touch layer assembly, and the touch display apparatus integrated with the touch layer assembly may realize touch sensing function. Referring to FIG. 1, the touch display apparatus 100 has a touch sensing region 104, in which touch of a finger of a user on the touch display apparatus 100 may be sensed. The touch layer assembly includes a substrate layer 61 and a plurality of sensing electrodes 62 disposed on the substrate layer 61. The substrate layer 61 is used to support the plurality of sensing electrodes 62. A capacitance, i.e., a self-capacitance is developed between a sensing electrode 62 and the ground. When the finger touches the touch sensing region 104 of the touch display apparatus 100, a capacitance may be superimposed on the sensing electrode 62, so that the capacitance developed between the sensing electrodes 62 and the ground changes. According to changing amount of the capacitance developed between the plurality of sensing electrodes 62 and the ground before and after the touch, coordinates of a touch point may be determined, thereby realizing the touch sensing. A pattern of the sensing electrode 62 is a metal mesh formed by connecting a plurality of metal lines with different extension directions. Two sensing electrodes 62 adjacent in a row direction are independent of each other, and two sensing electrodes 62 adjacent in a column direction are independent of each other. That is, the two sensing electrodes 62 adjacent in the row direction are not in contact with each other and are not electrically connected, and the two sensing electrodes 62 adjacent in the column direction are not in contact with each other and are not electrically connected.

Figure 2:
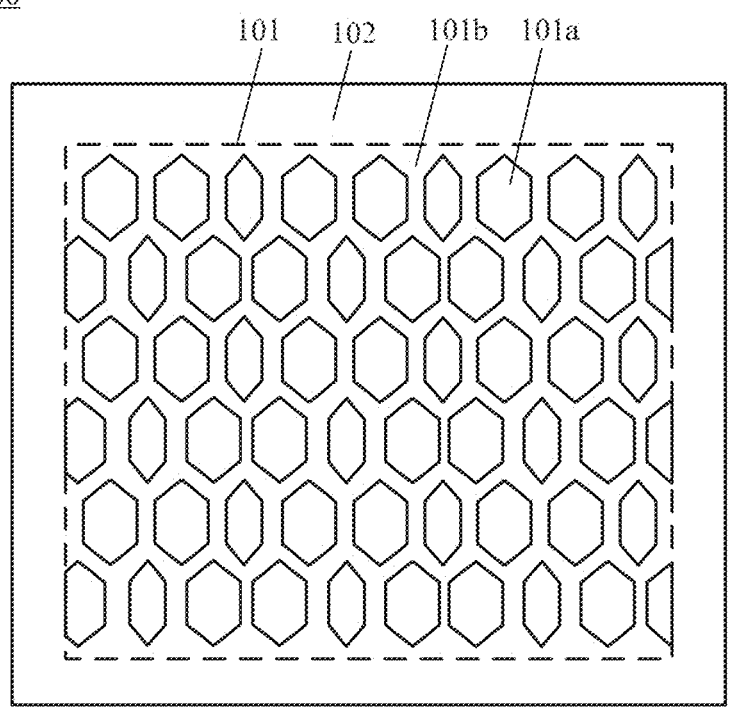
FIG. 2 is a diagram showing a region division of a touch display apparatus, in accordance with some embodiments of the present disclosure.

As shown in FIG. 1, the touch display apparatus 100 has a display region 101 and a peripheral region 102 located on at least one side of the display region 101. In the touch display apparatus, the display region 101 substantially coincides with the touch sensing region. For example, the touch sensing region may completely coincide with the display region 101. For another example, the touch sensing region may be larger than the display region 101, that is, edges of the display region 101 are located in the touch sensing region, thereby ensuring that a good touch effect may be realized at the edges of the display region 101. FIG. 1 shows an example in which the peripheral region 102 surrounds the display region 101. Referring to FIG. 2, the display region 101 includes a plurality of sub-pixel regions 101a and a pixel defining region 101b for defining the plurality of sub-pixel regions 101a.

The plurality of sub-pixel regions 101a include, for example, red sub-pixel regions, green sub-pixel regions and blue sub-pixel regions. For example, the sub-pixel region 101a may have a rectangular shape, or a hexagonal shape shown in FIG. 2.

Examples of the touch display apparatus 100 are as follows. The touch display apparatus 100 may be a liquid crystal display (LCD); the touch display apparatus 100 may also be a self-luminescent display apparatus. The self-luminescent display apparatus may be, for example, an organic light-emitting diode (OLED) display apparatus or a quantum dot light-emitting diode (QLED) display apparatus.

Figure 3A:
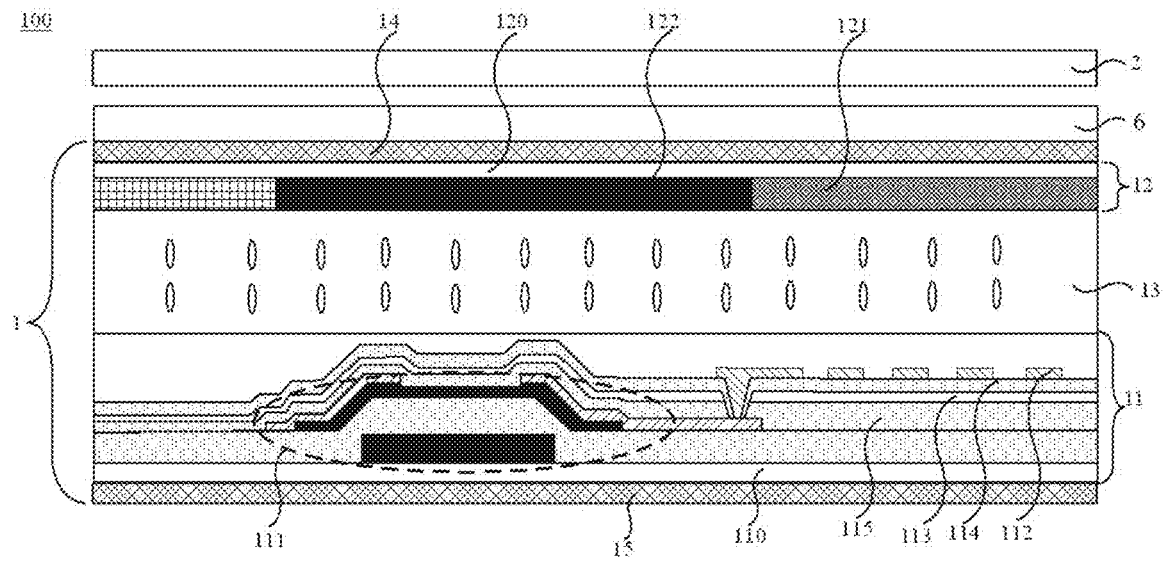
FIG. 3A is a diagram showing a structure of a touch display apparatus, in accordance with some embodiments of the present disclosure.
Figure 3B:
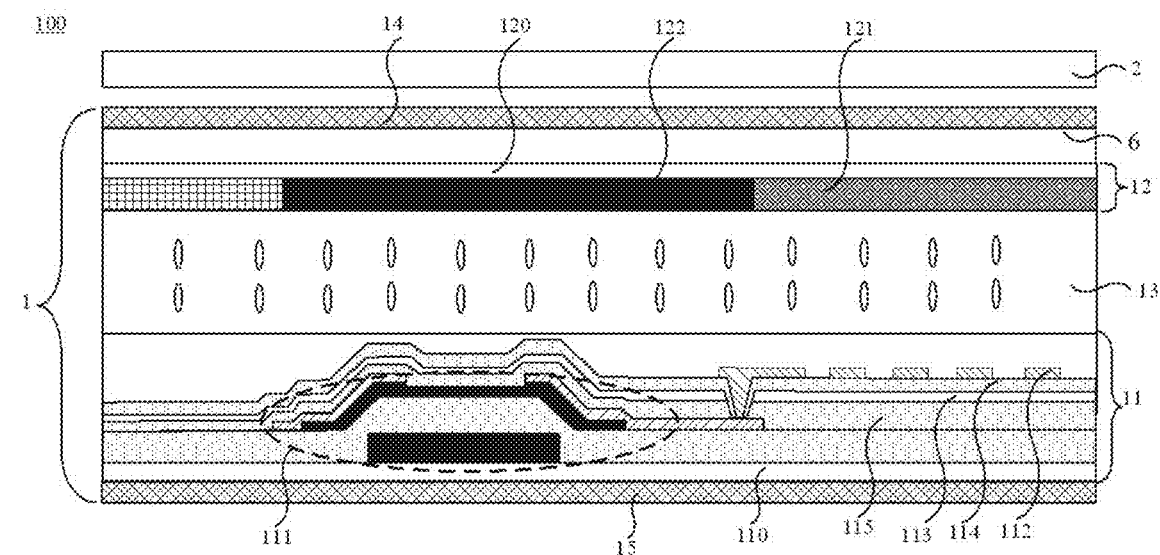
FIG. 3B is a diagram showing a structure of another touch display apparatus, in accordance with some embodiments of the present disclosure.
Figure 3C:
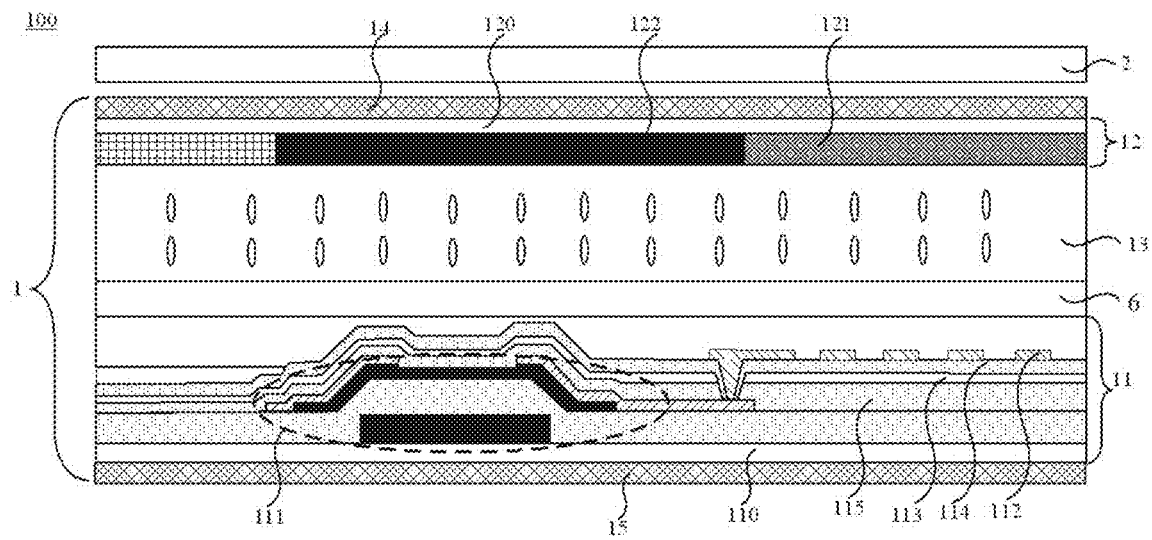
FIG. 3C is a diagram showing a structure of yet another touch display apparatus, in accordance with some embodiments of the present disclosure.

In a case where the touch display apparatus 100 is the liquid crystal display, the liquid crystal display includes a cover glass, the touch layer assembly, a liquid crystal display panel, and a backlight assembly. The backlight assembly is used to provide backlight for the liquid crystal display panel. As shown in FIGS. 3A, 3B and 3C, a main structure of the liquid crystal display panel 1 includes an array substrate 11, an opposite substrate 12, and a liquid crystal layer 13 disposed between the array substrate 11 and the opposite substrate 12.

As shown in FIGS. 3A, 3B and 3C, each sub-pixel 101a of the array substrate 11 is provided with a thin film transistor 111 and a pixel electrode 112 that are located on a first substrate 110. As shown in FIG. 3A, the array substrate 11 further includes a common electrode 113 disposed on the first substrate 110. The pixel electrode 112 and the common electrode 113 may be arranged in a same layer or in different layers. In a case where the pixel electrode 112 and the common electrode 113 are arranged in different layers, as shown in FIG. 3A, a first insulating layer 114 is disposed between the pixel electrode 112 and the common electrode 113. In a case where the common electrode 113 is disposed between the thin film transistor 111 and the pixel electrode 112, as shown in FIG. 3A, a second insulating layer 115 is disposed between the common electrode 113 and the thin film transistor 111. In some other embodiments, the opposite substrate 12 includes the common electrode 113 disposed on a second substrate 120.

As shown in FIGS. 3A, 3B and 3C, the opposite substrate 12 includes the second substrate 120 and a color filter (CF) layer 121 disposed on the second substrate 120. In this case, the opposite substrate 12 may also be referred to as a color filter substrate. The color filter layer 121 includes at least a red photoresist unit in the red sub-pixel region, a green photoresist unit in the green sub-pixel region, and a blue photoresist unit in the blue sub-pixel region. The opposite substrate 12 further includes a black matrix pattern 122 disposed on the second substrate 120. The black matrix pattern 122 is used for separating the red photoresist unit, the green photoresist unit, and the blue photoresist unit.

As shown in FIGS. 3A, 3B and 3C, the liquid crystal display panel 1 further includes an upper polarizer 14 disposed on a side of the opposite substrate 12 away from the liquid crystal layer 13 and a lower polarizer 15 disposed on a side of the array substrate 11 away from the liquid crystal layer 13.

In some embodiments, as shown in FIG. 3A, the touch layer assembly 6 is disposed outside the liquid crystal display panel 1. For example, the touch layer assembly 6 is disposed between the cover glass 2 and the upper polarizer 14. In this case, the touch display apparatus is referred to as an out-cell touch display apparatus, and the upper polarizer 14 serves as the substrate layer in the touch layer assembly 6. In some other embodiments, as shown in FIGS. 3B and 3C, the touch layer assembly 6 is disposed in the liquid crystal display panel 1. In this case, the touch display apparatus is referred to as an embedded touch display apparatus. In a case where the touch layer assembly 6 is disposed in the liquid crystal display panel 1, as shown in FIG. 3B, the touch layer assembly 6 may be disposed between the upper polarizer 14 and the opposite substrate 12; in this case, the touch display apparatus is referred to as an on-cell touch display apparatus, and the opposite substrate 12 serves as the substrate layer in the touch layer assembly 6. Alternatively, as shown in FIG. 3C, the touch layer assembly 6 may be disposed between the first substrate 110 and the second substrate 120; for example, the touch layer assembly 6 is disposed on the first substrate 110; in this case, the touch display apparatus is referred to as an in-cell touch display apparatus, and the array substrate 11 serves as the substrate layer in the touch layer assembly 6.

Figure 4A:
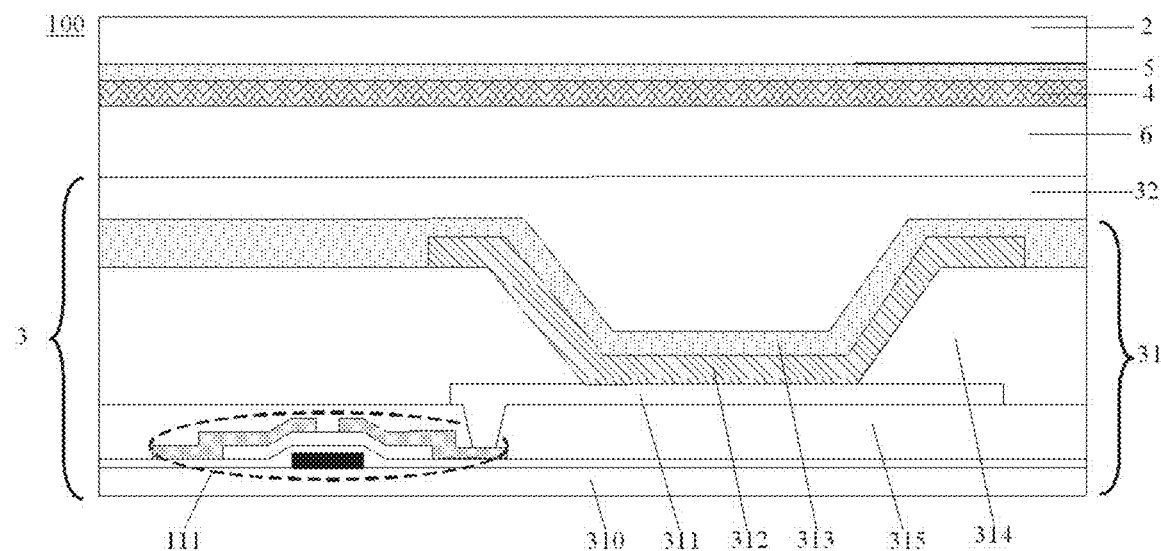
FIG. 4A is a diagram showing a structure of yet another touch display apparatus, in accordance with some embodiments of the present disclosure.
Figure 4B:
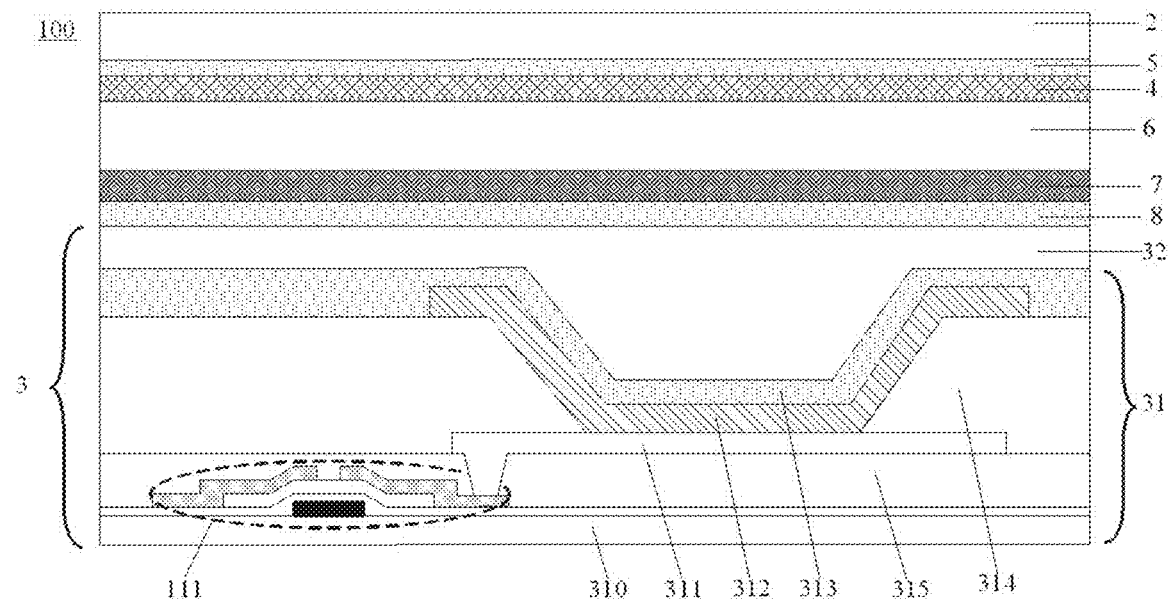
FIG. 4B is a diagram showing a structure of yet another touch display apparatus, in accordance with some embodiments of the present disclosure.

In a case where the touch display apparatus 100 is the self-luminescent display apparatus, as shown in FIGS. 4A and 4B, a main structure of the self-luminescent display apparatus includes a self-luminescent display panel 3, the touch layer assembly 6, a polarizer 4, a first optically clear adhesive (OCA) 5 and a cover glass 2 that are arranged in sequence.

The self-luminescent display panel 3 includes a display substrate 31 and an encapsulation layer 32 for encapsulating the display substrate 31. Here, the encapsulation layer 32 may be an encapsulation film or an encapsulation substrate.

As shown in FIGS. 4A and 4B, the display substrate 31 includes, in each sub-pixel 101a, a light-emitting device and a pixel driving circuit that are disposed on a third substrate 310. The pixel driving circuit includes a plurality of transistors 111. The light-emitting device includes a first electrode 311, a light-emitting functional layer 312, and a second electrode 313. The first electrode 311 is electrically connected to a drain of a transistor 111 as a driving transistor. The display substrate 31 further includes a pixel defining layer (PDL) 314. The pixel defining layer 314 includes a plurality of openings, and a light-emitting device corresponds to an opening.

In some embodiments, the light-emitting functional layer 312 includes a light-emitting layer. In some other embodiments, in addition to the light-emitting layer, the light-emitting functional layer 312 further includes one or more of an electron transport layer (ETL), an electron injection layer (EIL), a hole transport layer (HTL) and a hole injection layer (HIL).

As shown in FIG. 4A, the display substrate 31 further includes a planarization layer 315 disposed between the transistors 111 and the first electrodes 311.

A person skilled in the art will understand that, in the case where the touch display apparatus 100 is the self-luminescent display apparatus, the touch display apparatus 100 is easier to be manufactured into a flexible display apparatus. In this case, the third substrate 310 is a flexible substrate.

In the case where the touch display apparatus 100 is the self-luminescent display apparatus, in some embodiments, as shown in FIG. 4A, the substrate layer in the touch layer assembly 6 servers as the encapsulation layer 32, and other structures in the touch layer assembly 6 are directly provided on the encapsulation layer 32. In some other embodiments, as shown in FIG. 4B, the substrate layer in the touch layer assembly 6 serves as a substrate 7, and other structures in the touch layer assembly 6 are disposed on the substrate 7, the substrate 7 is adhered to the encapsulation layer 32 through a second optically clear adhesive 8. Here, as shown in FIG. 4A, in a case where the touch layer assembly 6 is directly provided on the encapsulation layer 32, a thickness of the touch display apparatus 100 is small, which facilitates to realize lightness and thinness.

Some embodiments of the present disclosure provide the touch layer assembly, which may be applied to the above touch display apparatus 100. Of course, the touch layer assembly may also be applied to other touch apparatuses.

Figure 5:
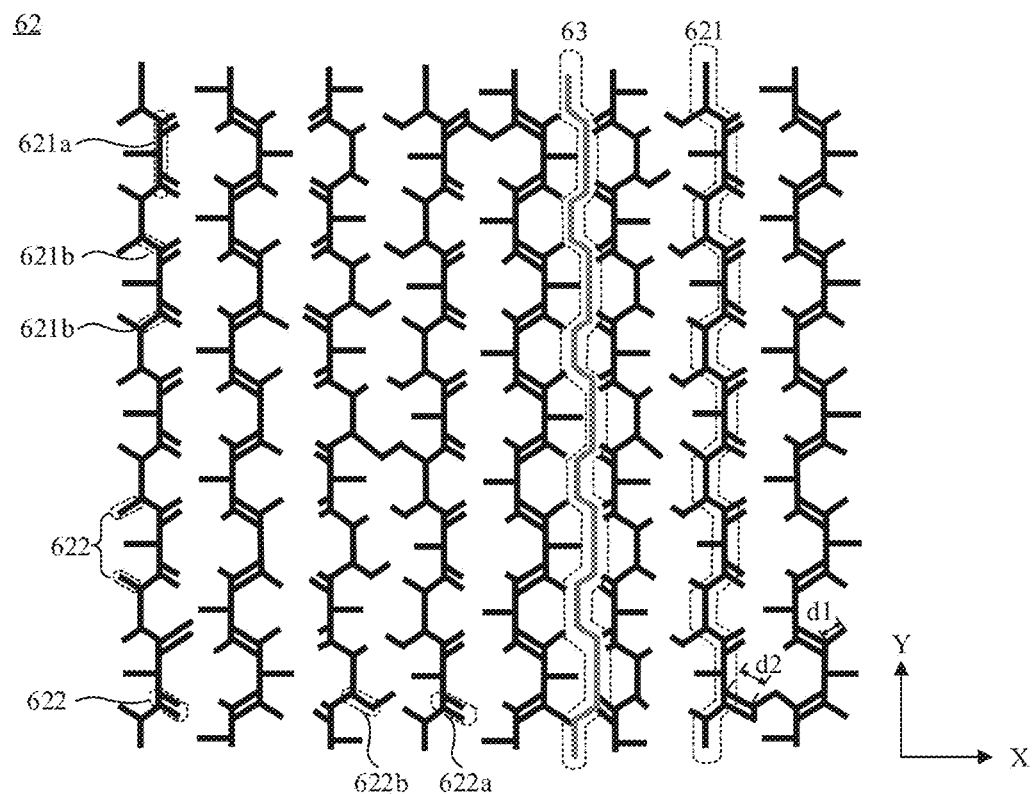
FIG. 5 is a diagram showing a structure of a sensing electrode, in accordance with some embodiments of the present disclosure.

For example, referring to FIG. 1, the touch layer assembly 6 further includes a plurality of effective touch lines 63 disposed on the substrate layer 61. In at least part (i.e., part or all) of the plurality of effective touch lines 63, at least one effective touch line 63 (e.g., each effective touch line 63) extends along a first direction, and multiple effective touch lines 63 are arranged in a second direction intersecting the first direction. The effective touch line is configured to transmit a sensing signal. Each effective touch line is coupled to a sensing electrode 62. As shown in FIG. 5, the first direction is a direction Y, the second direction is a direction X, and the first direction is perpendicular to the second direction. A shape of the effective touch line 63 is not limited. The effective touch line 63 may be a straight line extending along the direction Y, or may be a bending line including a plurality of bending points. The bending line extends along the direction Y. That is, a line connecting a start point and an end point of the bending line extends along the direction Y.

At least one sensing electrode 62 (e.g., each sensing electrode 62) is coupled to at least one effective touch line 63. For example, in at least part (i.e., part or all) of the plurality of sensing electrodes 62, each sensing electrode 62 may be coupled to only one effective touch line 63, or may be coupled to multiple effective touch lines 63, which is not limited. In a case where each sensing electrode 62 is coupled to multiple effective touch lines 63, the effective touch lines 63 are connected in parallel, so that an equivalent resistance is small, and impact on a voltage of a sensing signal is also small, which facilitates to improve accuracy of a sensing result. In the description of the present disclosure, for sake of clarity and conciseness of description, the description will be given by taking an example in which each sensing electrode 62 is coupled to one effective touch line 63.

In the touch layer assembly 6, referring to FIG. 5, each sensing electrode 62 includes a plurality of sensing main lines 621 arranged in the second direction. At least one sensing main line 621 (e.g., each sensing main line 621) extends along the first direction, and the sensing main line 621 is composed of a plurality of first sensing line segments 621a and a plurality of second sensing line segments 621b that are alternately connected. At least one first sensing line segment 621a (e.g., each first sensing line segment 621a) extends along the first direction, and at least one second sensing line segment 621b (e.g., each second sensing line segment 621b) is oblique relative to the first direction. The alternate connection may be that a first sensing line segment 621a and second sensing line segments 621b connected to one end of the first sensing line segment 621a are repeated multiple times in the first direction; or the alternate connection may be that a first sensing line segment 621a and at least two second sensing line segments 621b (e.g., multiple second sensing line segments 621*b*) connected to two ends of the first sensing line segment 621*a* are repeated multiple times in the first direction, and second sensing line segment (s) 621*b* located at one end of the first sensing line segment 621*a* are arranged in a different way from second sensing line segment(s) 621*b* located at the other end of the first sensing line segment 621*a*. For example, referring to FIG. 5, the sensing main line 621 extends along the direction Y, the first sensing line segment 621*a* is a straight line segment extending along the direction Y. and the second sensing line segment 621*b* is an oblique line segment that does not extend along the direction Y. The extension direction of the second sensing line segment 621*b* and the extension direction of the first sensing line segment 621*a* have an included angle therebetween, and the included angle is an obtuse angle. Of course, the included angle may also be an acute angle, which is not limited. The plurality of first sensing line segments 621*a* and the plurality of second sensing line segments 621*b* are alternately connected in various ways to constitute the sensing main line 621.

Figure 6:
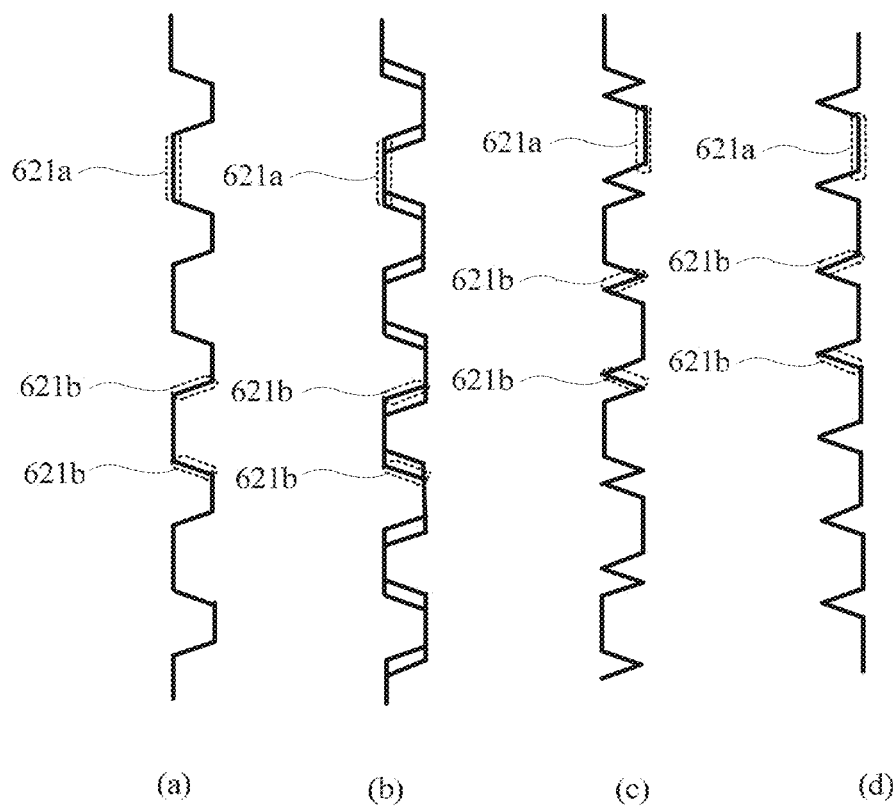
FIG. 6 is a diagram showing structures of sensing main lines, in accordance with some embodiments of the present disclosure.

The sensing main line is of many different structures. For example, referring to (a) in FIG. 6, each sensing main line 621 includes a plurality of first sensing line segments 621*a* and a plurality of second sensing line segments 621*b* that are alternately connected; except ends of the sensing main line 621, both ends of each first sensing line segment 621*a* are each coupled to one second sensing line segment 621*b*, and both ends of each second sensing line segment 621*b* are each coupled to one first sensing line segment 621*a*. For another example, referring to (b) in FIG. 6, except ends of the sensing main line 621, both ends of each first sensing line segment 621*a* are each coupled to two second sensing line segments 621*b*, and both ends of each second sensing line segment 621*b* are each coupled to one first sensing line segment 621*a*. For yet another example, referring to (c) in FIG. 6, except ends of the sensing main line 621, both ends of each first sensing line segment 621*a* are each coupled to one second sensing line segment 621*b*; an end of each of part of the second sensing line segments 621*b* in the sensing main line 621 is coupled to one first sensing line segment 621*a*, and another end thereof is coupled to one second sensing line segment 621*b*; and both ends of each of remaining second sensing line segments 621*b* in the sensing main line 621 are coupled to two second sensing line segments 621*b*, respectively. For yet another example, referring to (d) in FIG. 6, except ends of the sensing main line 621, both ends of each first sensing line segment 621*a* are each coupled to one second sensing line segment 621*b*, and one end of each second sensing line segment 621*b* is coupled to one first sensing line segment 621*a*, and the other end thereof is coupled to one second sensing line segment 621*b*. The sensing main line 621 may also be provided in other ways, which is not limited.

Referring to FIG. 5, each sensing electrode 62 further includes a plurality of third sensing line segments 622 connected to at least one sensing main line 621. For example, each sensing main line 621 is connected to a plurality of third sensing line segments 622. At least one third sensing line segment 622 (e.g., each third sensing line segment 622) is oblique relative to the first direction. For example, the third sensing line segment 622 is an oblique line segment that does not extend along the direction Y; and an extension direction of the third sensing line segment 622 and the direction Y have an included angle therebetween, and the included angle is an obtuse angle. Of course, the included angle may also be an acute angle, which is not limited.

For example, referring to FIG. 5, an end of the first sensing line segment 621*a* in each sensing main line 621 is connected to at least one third sensing line segment 622 (e.g., one or two third sensing line segments 622, which is not limited) in addition to second sensing line segment(s) 621*b*. The second sensing line segment(s) 621*b* and the third sensing line segment(s) 622 that are connected to the end of the same first sensing line segment 621*a* are located on different sides of the first sensing line segment 621*a*. Since the sensing main line 621 is connected to the plurality of third sensing line segments 622, a sensing area of the sensing electrode 62 may be enlarged, and a touch sensing amount of the sensing electrode 62 is large, which is conducive to improving touch sensing effect. For example, an end of each of part of the first sensing line segments 621*a* in the sensing main line 621 is connected to one second sensing line segment 621*b*, and is further connected to two third sensing line segments 622; and the second sensing line segment 621*b* is located on a side of the first sensing line segment 621*b*, and the two third sensing line segments 622 are located on another side of the sensing line segment 621*a* opposite to the side in the second direction; and another end of the first sensing line segment 621*a* is also connected to one second sensing line segment 621*b* and two third sensing line segments 622. The third sensing line segments 622 connected to different ends of the first sensing line segment 621*a* are located on two sides of the first sensing line segment 621*a* in the first direction and on the same side of the first sensing line segment 621*a* in the second direction. For another example, with continued reference to FIG. 5, an end of each of part of the first sensing line segments 621*a* in the sensing main line 621 is connected to two second sensing line segments 621*b*, and is further connected to one third sensing line segment 622; the two second sensing line segments 622 are located on a side of the first sensing line segment 621*a*, and the third sensing line segment 622 is located on another side of the first sensing line segment 621*a* opposite to the side in the second direction; and another end of the first sensing line segment 621*a* is also connected to two second sensing line segments 621*b* and one third sensing line segment 622. The third sensing line segments 622 connected to different ends of the first sensing line segment 621*a* are located on two sides of the first sensing line segment 621*a* in the first direction and on the same side of the first sensing line segment 621*a* in the second direction.

Referring to FIG. 5, at least one third sensing line segment 622 (e.g., multiple third sensing line segments 622) in the plurality of third sensing line segments 622 in the sensing electrode 62 has a free line end. The free line end is a line end that is not in contact with other line ends. For example, an end of each of part of the third sensing line segments 622 is connected to the sensing main line 621, and another end thereof is independent from other line ends.

Figure 7:
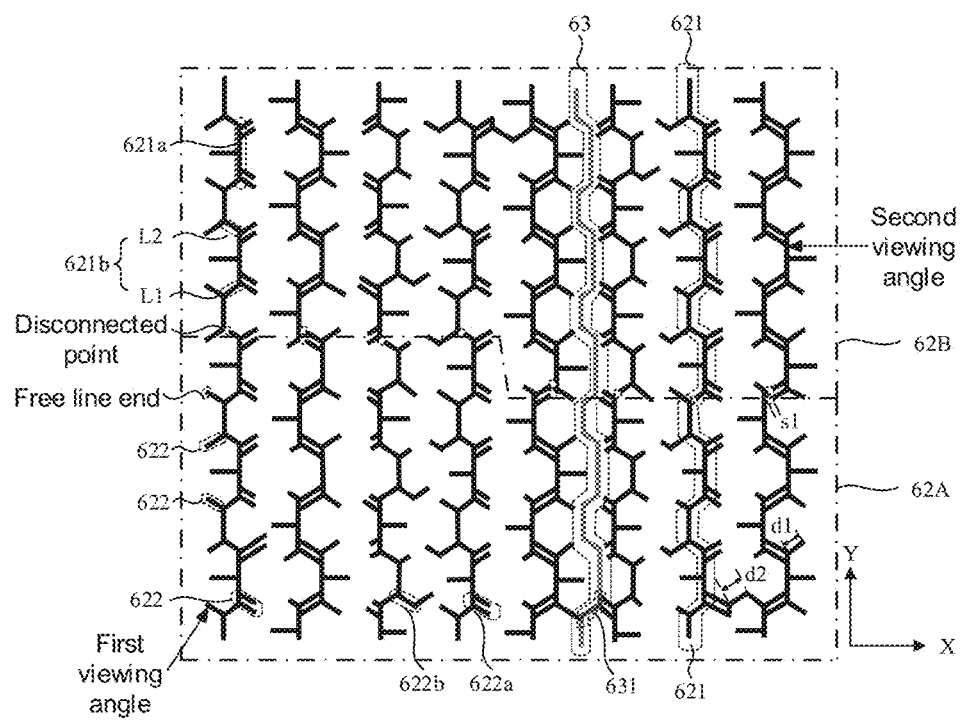
FIG. 7 is a diagram showing structures of a first sensing electrode and a second sensing electrode, in accordance with some embodiments of the present disclosure.

Referring to FIG. 7, the sensing electrodes 62 include a first sensing electrode 62A and a second sensing electrode 62B that are adjacent in the first direction. In the first sensing electrode 62A and the second sensing electrode 62B, a disconnected point where two sensing main lines 621 adjacent in a same extension direction are disconnected is located on a second sensing line segment 621*b* at an end of a sensing main lines 621 of the two sensing main lines 621. For example, any two sensing electrodes 62 adjacent in the direction Y are a first sensing electrode 62A and a second sensing electrode 62B, and each sensing main line 621 included in the first sensing electrode 62A corresponds to a respective sensing main line 621 in the second sensing electrode 62B extending in a same direction as the sensing main line 621 included in the first sensing electrode 62A. Referring to the above content, sensing main lines 621 arranged in a same extension direction may be obtained by providing disconnected points on a metal line extending along the direction Y and passing through sensing electrodes 62 arranged in the direction Y. Similarly, a plurality of metal lines passing through the first sensing electrode 62A and the second sensing electrode 62B are divided by disconnected points into sensing main lines 621 that belong to the two adjacent sensing electrodes 62, respectively. The disconnected point may be located on a second sensing line segment 621b at an end, close to the second sensing electrode 62B, of a sensing main line 621 in the first sensing electrode 62A; or may be located on a second sensing line segment 621b at an end, close to the first sensing electrode 62A, of a sensing main line 621 in the second sensing electrode 62B, as long as the disconnected point is located at an end of an oblique second sensing line segment 621b.

A region covered by sensing main lines 621 and a plurality of third sensing line segments 622 connected to the sensing main lines 621 is a sensing region of a sensing electrode 62. Each sensing main line 621 provided with the disconnected points has two ends, and the sensing main lines 621 have a plurality of ends. Third sensing line segments 622 closet to the ends of the sensing main lines 621 and the plurality of ends define a boundary of the sensing electrode 62. The sensing electrode 62 also has a plurality of free line ends at the boundary thereof, and each free line end is an end of a respective second sensing line segment 621b.

Since a metal line has a certain thickness and is subject to an existing technological level, a side face of a formed metal line is a slope surface, and side faces of metal line segments obtained by providing disconnected points on the metal line are also slope surfaces. In a high-brightness environment, the side face of the metal line segment may reflect light, and an intensity of the reflected light is related to a length of the side face of the metal line segment. The larger the length of the side face of the metal line segment, the larger the reflection area thereof, and the stronger the intensity of the reflected light; and conversely, the weaker the intensity of the reflected light. A length of a side face of a metal line segment provided with a disconnected point is smaller than a length of a side face of a metal line segment provided with no disconnected point, and accordingly, an intensity of light reflected by the side face of the metal line segment provided with the disconnected point is weaker than an intensity of light reflected by the side face of the metal line segment provided with no disconnected point. In a case where the metal line segment provided with the disconnected point and the metal line segment provided with no disconnected point are both present, a difference in the lengths of the side faces of the metal line segments leads to a difference in the intensities of the reflected light. When the touch display apparatus is viewed from a direction perpendicular to the side faces of the metal line segments, the difference in the intensities of the reflected light may be visually perceived by a user, which is displayed as Mura, so that a display effect of the touch display apparatus is affected. An angle between a line along which the light reflected by the side face of the metal line may be viewed and a direction that is perpendicular to the reflective side face of the metal line segment is referred to as a viewing angle.

Referring to FIG. 7, third sensing line segments 622 with free line ends may be obtained by providing disconnected points at ends of the third sensing line segments 622, so that the third sensing line segments 622 are independent from other line ends. In combination with the above, referring to FIG. 7, in the embodiments of the present disclosure, the disconnected points are all provided on oblique metal line segments that are oblique relative to the first direction, and no disconnected point is provided on the first sensing line segment 621a extending along the first direction. In this way, there is only a viewing angle between the lines and the direction that is perpendicular to the oblique metal line segment (i.e., oblique relative to the first direction), and no viewing angle between the lines and the direction perpendicular to the first direction that appears due to the disconnected point being provided on the first sensing line segment 621a will be added. As a result, on a premise that the sensing area is increased through the third sensing line segments 622, it is possible to avoid adding a viewing angle caused by the difference in the intensities of the reflected light as much as possible to reduce visualization risk.

For example, at least one third sensing line segment 622 (e.g., each third sensing line segment 622) is parallel to a respective second sensing line segment 621b. For example, referring to FIG. 7, each line end of part of the first sensing line segments 621a is connected to a respective second sensing line segment 621b and a respective third sensing line segment 622; the second sensing line segment 621b and the third sensing line segment 622 that are connected to the same line end are located on two sides of the first sensing line segment 621a, respectively, and a third sensing line segment 622 connected to an line end of the first sensing line segment is parallel to a second sensing line segment 621b connected to another line end of the first sensing line segment.

For example, referring to FIG. 7, an effective touch line 63 (e.g., each effective touch line 63) includes at least one coupling portion 631 (e.g., one or more coupling portions 631), and the at least one coupling portion 631 (e.g., each coupling portion 631) is electrically connected to a sensing electrode 62. An orthographic projection, on the substrate layer 61, of a portion of the effective touch line 63 other than the at least one coupling portion 631 is not overlapped with orthographic projections, on the substrate layer 61, of the sensing electrodes 62. For example, referring to FIG. 1, an effective touch line 63 sequentially passes through multiple sensing electrodes 62 (e.g., a column of sensing electrodes 62). Considering an example in which four sensing electrodes 62 are arranged in a column, only one sensing electrode 62 of the four sensing electrodes 62 is coupled to the effective touch line 63, and remaining sensing electrodes 62 thereof are not electrically connected to the effective touch line 63. Since the effective touch line 63 is electrically connected to only one sensing electrode 62, an orthographic projection, on the substrate layer 61, of the at least one coupling portion 631 (e.g., one or more coupling portions 631) included in the effective touch line 63 is located in an orthographic projection of a region covered by the sensing electrode 62 coupled to the effective touch line 63 on the substrate layer 61. Orthographic projections, on the substrate layer 61, of sensing electrodes 62 that are not coupled to the effective touch line 63 passing through them are not overlapped with an orthographic projection, on the substrate layer 61, of the effective touch line 63.

The coupling portion 631 is a portion of the effective touch line 63, and a shape of the coupling portion 631 is not limited. For example, the orthographic projection, on the substrate layer 61, of the coupling portion 631 may be overlapped with an orthographic projection, on the substrate layer 61, of at least part of a respective one of the third sensing line segments 622 (e.g., only a line end thereof or an entire third sensing line segment). For example, referring to FIG. 7, the orthographic projection, on the substrate layer 61, of the coupling portion 631 is overlapped with an orthographic projection, on the substrate layer 61, of a third sensing line segment 622.

In a case where the orthographic projections, on the substrate layer 61, of the sensing electrodes 62 that are not electrically connected to the effective touch line 63 and the orthographic projection, on the substrate layer 61, of the effective touch line 63 have overlapping regions, a coupling capacitance, i.e., a parasitic capacitance is created between metal line segments that have the overlapping region. A capacitive load of the sensing electrode 62 is increased due to the parasitic capacitance, which does not facilitate to improve a touch reporting rate and a signal-to-noise ratio. In the embodiments of the present disclosure, the orthographic projections, on the substrate layer 61, of the sensing electrodes 62 that are not coupled to the effective touch line 63 are not overlapped with the orthographic projection, on the substrate layer 61, of the effective touch line 63, which may reduce the capacitive load of the sensing electrode 62, so that the above problem may be avoided. Moreover, since each effective touch line 63 is coupled to a respective sensing electrode 20, even if an orthographic projection, on the substrate layer 61, of a coupling portion 631 of the effective touch line 63 and an orthographic projection, on the substrate layer 61, of the sensing electrode 62 coupled to the effective touch line 63 have an overlapping region, there is no coupling capacitance created between the effective touch line 63 and the sensing electrode 62.

Referring to FIG. 7, it can be understood that, the extension direction of the effective touch line 63 is same as the extension direction of the sensing main line 621, and the extension direction of the effective touch line 63 is different from the extension direction of the third sensing line segment 622. In order to ensure the sensing area of the sensing electrode 62 and rationality of wiring, the effective touch line 63 and the sensing main line 621 need to be staggered in the second direction, so that a region occupied by the sensing main line 621 in the sensing electrode 62 is made as large as possible, and it is possible to avoid that the orthographic projection of the effective touch line 63 on the substrate layer 61 is overlapped with an orthographic projection of the sensing main line 621 on the substrate layer 61. In addition, in order to make the sensing area of the sensing electrode 62 as large as possible, in a case of considering an allowable overlay in the technological process, the third sensing line segment 622 should be as much as possible. That is, the third sensing line segment 622 has the free line end, where an avoidance design is provided, which may make a distance between the end of the third sensing line segment 622 and the effective touch line 63 as small as possible, but may avoid that the orthographic projection of the effective touch line 63 on the substrate layer 61 is overlapped with the orthographic projection of the third sensing line segment 622 on the substrate layer 61.

In some examples, referring to FIG. 7, third sensing line segments 622 extending along a same direction include a first-type third sensing line segment 622a with an end being a free line end and a second-type third sensing line segment 622b with neither end being a free line end. A length of the first-type third sensing line segment 622a is d1, and a length of the second-type third sensing line segment 622b is d2. For example, one end of the first-type third sensing line segment 622a is the free line end. That is, the end of the first-type third sensing line segment 622a is provided with the avoidance design to avoid that an orthographic projection of the first-type third sensing line segment 622a on the substrate layer 61 is overlapped with the orthographic projection of the effective touch line 63 on the substrate layer 61. Therefore, the length d1 of the first-type third sensing line segment 622a is smaller than the length d2 of the second-type third sensing line segment 622b. With continued reference to FIG. 7, in order to make the sensing area as large as possible, the first-type third sensing line segments 622a should be set as many as possible. Therefore, the number of first-type third sensing line segments 622a is much larger than the number of second-type third sensing line segments 622b.

Referring to FIG. 7, disconnected points where metal lines in two adjacent sensing electrodes 62 are disconnected are provided at ends of second sensing line segments 621b of sensing main lines 621 in the sensing electrodes 62. Due to the disconnected points, a length of a second sensing line segment 621b provided with the disconnected point is reduced compared with a length of a second sensing line segment 621b provided with no disconnected point, and a reduced length is s1. A length of the first-type third sensing line segment 622a with the avoidance design is also reduced compared with a length of the second-type third sensing line segment 622b with no avoidance design, a reduced length is s2, and s2 is a difference of d2 and d1 (s2=d2−d1).

The avoidance design needs to reserve the first-type third sensing line segment 622a as much as possible, and arrangement of the disconnected points needs to ensure that sensing main lines 621 of two adjacent sensing electrodes 62 are completely independent from each other. Therefore, a reduction degree of the length due to the disconnected point is greater than a reduction degree of the length due to the avoidance design. That is, s1 is greater than s2 (s1>s2). Similarly, for the first sensing line segment 621a, if in the first sensing electrode 62A and the second sensing electrode 62B, a disconnected point where two sensing main lines 621 adjacent in the same extension direction are disconnected is located on a first sensing line segment 621a at an end of a sensing main lines 621 of the two sensing main lines 621, a difference between a length of a first sensing line segment 621a provided with no disconnected point and a length of the first sensing line segment 621a provided with the disconnected point is s1.

With continued reference to FIG. 7, in combination with the above content, since each third sensing line segment 622 extends in the same direction as a respective second sensing line segment 621b, a viewing angle of light reflected by a side face of the third sensing line segment 622 is the same as a viewing angle of light reflected by a side face of the second sensing line segment 621b, which is a first viewing angle. A viewing angle of light reflected by a side face of the first sensing line segment 621a is different from viewing angles of light reflected by side faces of the second sensing line segment 621b and the third sensing line segment 622, and the viewing angle of light reflected by the side face of the first sensing line segment 621a is a second viewing angle. At the first viewing angle, a difference between a length of each of second sensing line segments 621b provided with disconnected points and a length of each of second sensing line segments 621b provided with no disconnected points is s1. The number of the first-type third sensing line segments 622a is much larger than the number of the second-type third sensing line segments 622b. Therefore, a difference between the length of the second sensing line segment 621b provided with the disconnected point and a length of each third sensing line segment 622 extending in the same direction as the second sensing line segments 621b at the first viewing angle may be regarded as a difference between the length of the second sensing line segment 621b provided with the disconnected point and a length of each first-type third sensing line segment 622a extending in the same direction as the second sensing line segment 621b at the first viewing angle, which is a difference of s1 and s2 (s1−s2). At the second viewing angle, a difference between lengths is s1. Obviously, s1 is larger than a difference of s1 and s2 (s1>s1−s2). Therefore, in the sensing electrode 62, a total of differences in lengths at the first viewing angle is smaller. That is, a total of differences in lengths of the side faces of the metal line segments is smaller. Correspondingly, the difference in the intensities of the reflected light caused by the difference between the lengths of the side faces of the metal line segments is also smaller, so that the display of Mura may be avoided, and a better display effect of the touch display apparatus may be realized.

For example, as shown in FIG. 7, in the touch layer assembly, the plurality of second sensing line segments 621b include first oblique line segments L1 and second oblique line segments L2. An angle from the first direction clockwise to an extension direction of the first oblique line segment L1 is an acute angle, and an angle from the first direction clockwise to an extension direction of the second oblique line segment L2 is an obtuse angle. For example, referring to FIG. 7, the second sensing line segments 621b oblique relative to the first direction may be divided into first oblique line segments L1 and second oblique line segments L2. Oblique directions, i.e., extension directions, of the first oblique line segment L1 and the second oblique line segment L2 are different. A first oblique line segment L1 and a second oblique line segment L2 that are connected to a first sensing line segment 621a are located on a same side of the first sensing line segment 621a in the second direction, and are located at both ends of the first sensing line segment 621a. In a case where the above limitation on the first oblique line segment L1 and the second oblique line segment L2 is satisfied, the plurality of first oblique line segments L1 may extend in a same direction or different directions, and the plurality of second oblique line segments L2 may extend in a same direction or different directions, which is not limited.

In the disconnected points where the first sensing electrode 62A and the second sensing electrode 62B are disconnected, a part of the disconnected points are located on first oblique line segments L1, and a remaining part of the disconnected points are located on second oblique line segments L2. For example, referring to FIG. 7, except at the ends of the sensing main lines 621, an end of each first sensing line segment 621a is connected to at least one first oblique line segment L1 (e.g., one first oblique line segment L1), and another end thereof is connected to at least one second oblique line segment L2 (e.g., one second oblique line segment L2). The extension directions of the first oblique line segment L1 and the second oblique line segment L2 are different, and viewing angles thereof are also different. Therefore, by dispersedly providing the disconnected points where the first sensing electrode 62A and the second sensing electrode 62B are disconnected on the first oblique line segments L1 and the second oblique line segments L2, only a part of disconnected points may cause the visualization risk at a viewing angle, and remaining disconnected points may not affect display effect at this viewing angle. In this way, the total of differences in lengths is reduced, thereby reducing the visualization risk caused by the difference in the intensities of the reflected light, and facilitating improvement of the display effect.

Figure 8:
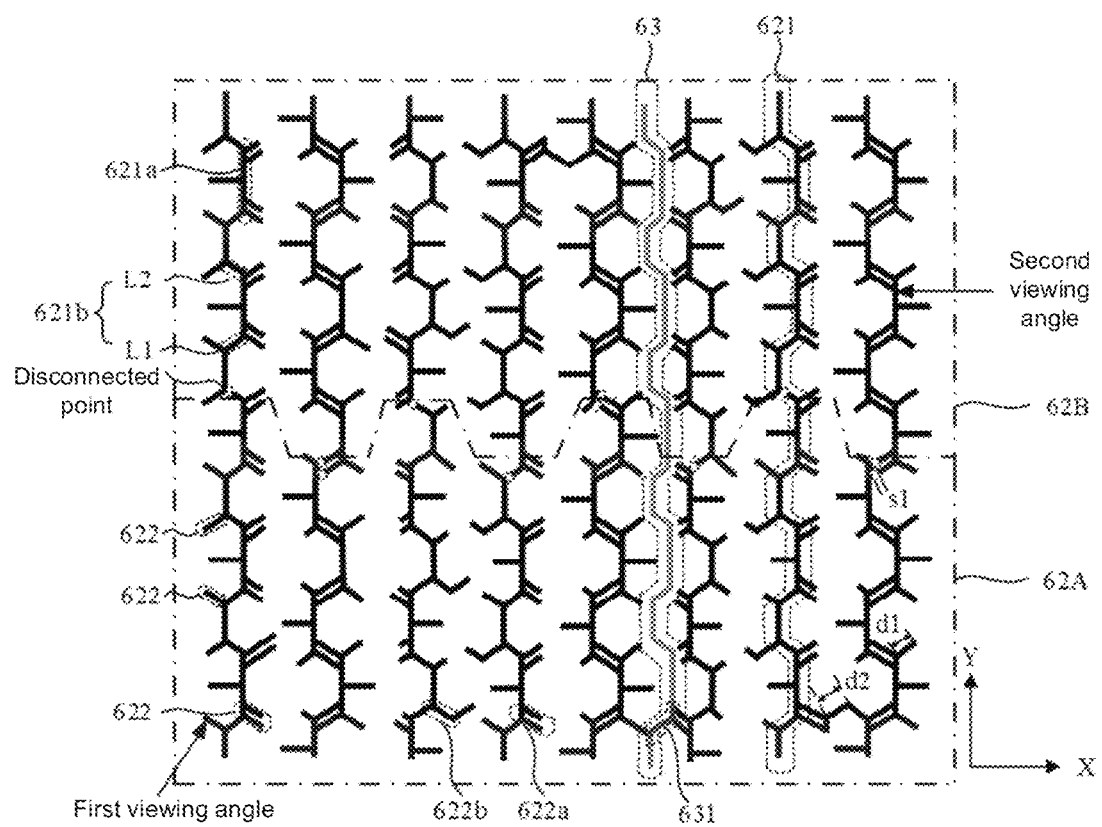
FIG. 8 is a diagram showing structures of a first sensing electrode and a second sensing electrode, in accordance with some other embodiments of the present disclosure.

For example, in the touch layer assembly, in the second direction, the disconnected points where the first sensing electrode 62A and the second sensing electrode 62B are disconnected are alternately distributed on first oblique line segments L1 and second oblique line segments L2. For example, referring to FIG. 8, disconnected points on two sensing main lines 621 adjacent in the second direction are alternately distributed on a first oblique line segment L1 and a second oblique line segment L2 that extend in different directions. That is, in any two sensing main lines 621 adjacent in the direction X, a disconnected point on one sensing main line 621 is provided on a first oblique line segment L1, and a disconnected point on the other sensing main line 621 is provided on a second oblique line segment L2. In a case where a total number of sensing main lines 621 in a row of sensing electrodes 62 is n, and n is an even number, a total number of disconnected points at boundaries of a row of sensing electrodes 62 is also n. A half of the n (n/2) disconnected points are distributed on first oblique line segments L1 in the row of sensing electrodes 62 extending in a direction, and a remaining half of the n (i.e., n/2) disconnected points are distributed on second oblique line segments L2 in the row of sensing electrodes 62 extending in another direction. By alternately providing the disconnected points on the second sensing line segments 621b extending in different directions, there are only a half of the n (i.e., n/2) disconnected points with the visualization risk at a viewing angle, a density of the disconnected points is reduced, and distribution of the plurality of disconnected points is more dispersed, so that the visualization risk may be further reduced, and it is possible to facilitate to improve the display effect. As described above, in a case where the total number of the sensing main lines 621 in the row of sensing electrodes 62 is n, and n is an odd number, a half of a difference of n and 1 (i.e., (n−1)/2) disconnected points or a half of a sum of n and 1 (i.e., (n+1)/2) disconnected points are uniformly distributed on second sensing line segments 621b in the row of sensing electrodes 62 extending in a direction, and the above beneficial effects may also be achieved, and details will not be repeated here.

Figure 9:
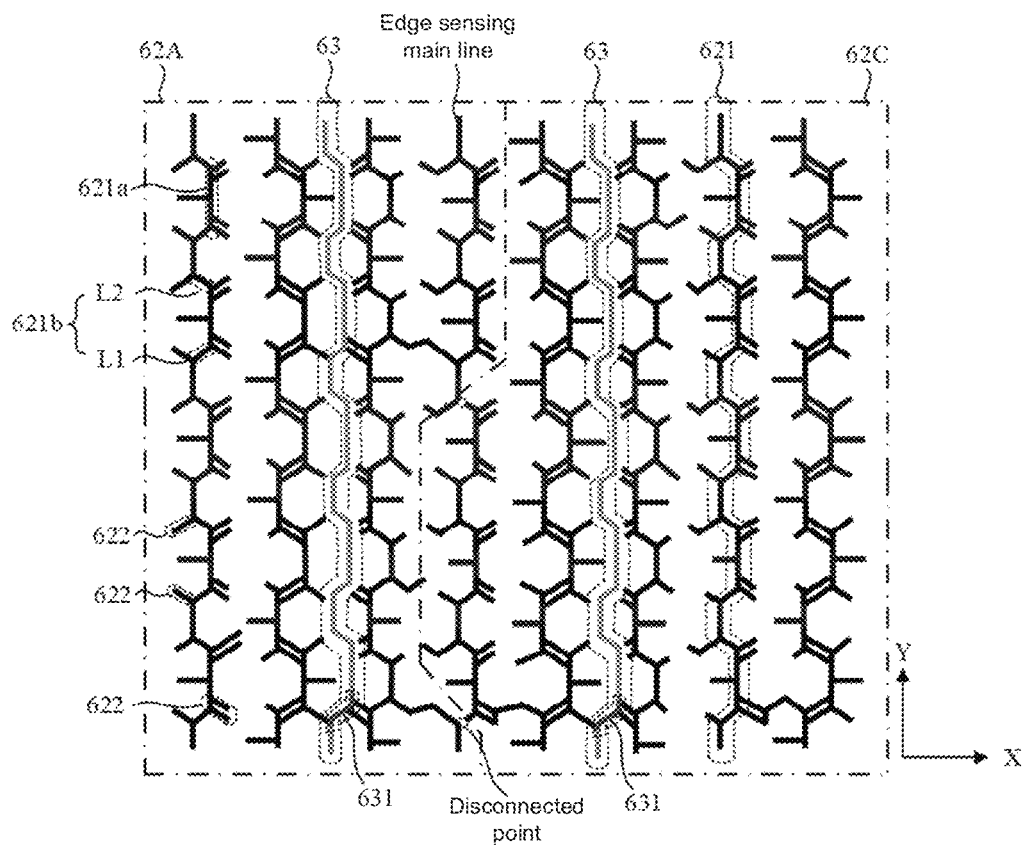
FIG. 9 is a diagram showing structures of a first sensing electrode and a third sensing electrode, in accordance with some embodiments of the present disclosure.

For example, referring to FIG. 9, the sensing electrodes 62 further includes a third sensing electrode 62C adjacent to the first sensing electrode 62A in the second direction. An edge sensing main line located at a border between the first sensing electrode 62A and the third sensing electrode 62C is provided with at least one disconnected point. The at least one disconnected point divides the edge sensing main line into a plurality of disconnected lines, the plurality of disconnected lines are not connected to one another, and at least one of the disconnected lines that is not connected to the first sensing electrode 62A is connected to the third sensing electrode 62C. The edge sensing main line 621 is a sensing main line 621 located at the border between the first sensing electrode 62A and the third sensing electrode 62C, and at least one disconnected point is located on second sensing line segment(s) 621b of the edge sensing main line. For example, three disconnected points are located on second sensing line segments 621b of the edge sensing main line. For example, any two sensing electrodes 62 adjacent in the direction X are a first sensing electrode 62A and a third sensing electrode 62C in sequence. One of the sensing main lines 621 located at the border between the first sensing electrode 62A and the third sensing electrode 62C is an edge sensing main line, and the edge sensing main line is provided with at least one disconnected point. For example, there are two disconnected points dividing the entire edge sensing main line 621 into three disconnected lines, two of the three disconnected lines are coupled to the first sensing electrode 62A, and a remaining disconnected line is coupled to the third sensing electrode 62C. Therefore, boundaries of the first sensing electrode 62A and the third sensing electrodes 62C coincide. When there is a touch in a boundary region, the touch may be sensed by the first sensing electrode 62A and the third sensing electrode 62C, so that a touch sensing amount is large, and a sensing effect may be improved. The disconnected point is provided on the second sensing line segment 621b, which may avoid increasing a new viewing angle, so as to avoid increasing the visualization risk and improve the sensing effect.

Figure 10:
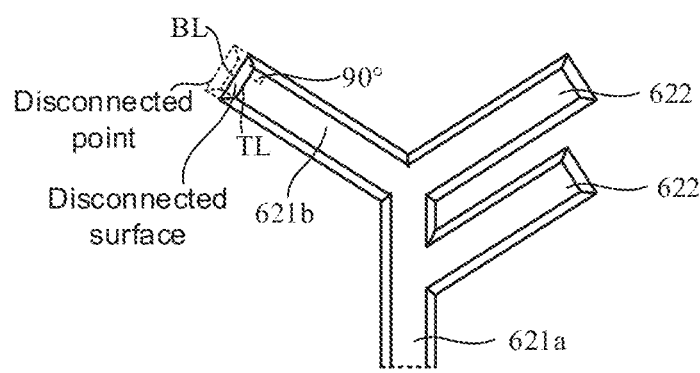
FIG. 10 is a diagram showing a structure in which a disconnected point is provided, in accordance with some embodiments of the present disclosure.

For example, referring to FIG. 10, an extension direction of an upper edge TL of a disconnected surface at a first disconnected point (i.e., a disconnected point) of a second sensing line segment 621b is perpendicular to an extension direction of the second sensing line segment 621b provided with the first disconnected point. The upper edge TL is an edge, away from the substrate layer, of edges of the disconnected surface. For example, the extension direction of the upper edge TL of the disconnected surface at the first disconnected point of the second sensing line segment 621b should be made perpendicular to the extension direction of the second sensing line segment 621b provided with the first disconnected point as much as possible in a case where the process level may achieve it. Due to limitation of the process level, in a case where an included angle between the extension directions is in a numerical range of 85° to 95° inclusive, the extension directions may be regarded as being perpendicular. The upper edge TL and a lower edge BL of the disconnected surface of the second sensing line segment 621b are parallel, and an extension direction of the lower edge BL is also perpendicular to the extension direction of the second sensing line segment 621b. Subject to the existing technological level, when a disconnected point is formed, a sharp angle at a sharp-angled line end (at which an included angle between an orthographic projection of an edge of a disconnected surface of a metal line on the substrate layer 61 and an extension direction of the metal line is an acute angle) may be formed as a rounded angle (at which the orthographic projection of the edge of the disconnected surface of the metal line on the substrate layer 61 is a curved line), which causes a large difference between a shape of an actually formed line end and a shape of a designed line end. A difference between a shape of an actual line end formed by a right angle at a right-angled line end (at which an included angle between an orthographic projection of an edge of a disconnected surface of a metal line on the substrate layer 61 and an extension direction of the metal line is a right angle) through an etching process and a shape of the designed line end is small, which is more in line with process requirements. Moreover, point discharge is prone to occur at the sharp-angled line end, and providing the line end as a right-angled line end may prevent occurrence of the point discharge, thereby avoiding damage to the touch display apparatus, and ensuring service life of the touch display apparatus.

Figure 11:
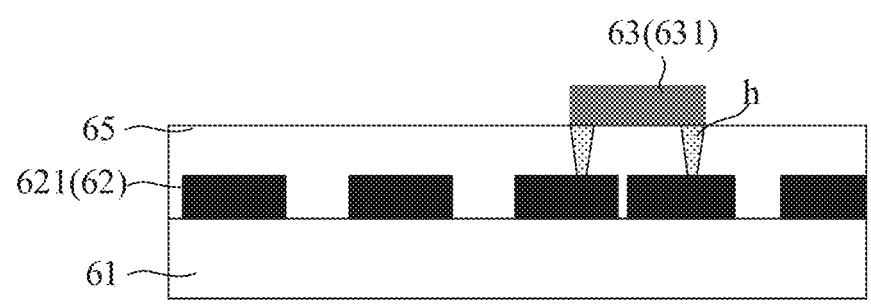
FIG. 11 is a diagram showing a structure in which an effective touch line and a sensing electrode are coupled, in accordance with some embodiments of the present disclosure.
Figure 12:
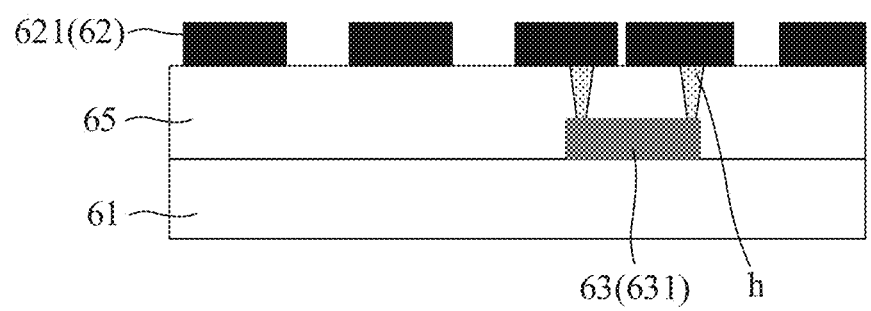
FIG. 12 is a diagram showing a structure in which an effective touch line and a sensing electrode are coupled, in accordance with some other embodiments of the present disclosure.

For example, as shown in FIGS. 11 and 12 each sensing electrode 62 and at least one effective touch line 63 coupled to the sensing electrode 62 are arranged in different layers. The touch layer assembly further includes an insulating layer 65 disposed between the sensing electrode 62 and the effective touch line 63, and each coupling portion 631 is coupled to the sensing electrode 62 through at least one via hole h in the insulating layer 65. Referring to FIG. 11, each sensing electrode 62 is provided thereon with a respective effective touch line 63 coupled thereto, and a coupling portion 631 of the effective touch line 63 is coupled to two sensing main lines 621 of the sensing electrode 62 through two via holes h. The relative position of the sensing electrode 62 and the effective touch line 63 is not limited. For example, referring to FIG. 11, the sensing electrode 62 may be closer to the substrate layer 61 relative to the effective touch line 63. For another example, referring to FIG. 12, the effective touch line 63 may be closer to the substrate layer 61 relative to the sensing electrode 62, so that the sensing electrode 62 is away from a driving circuit for controlling image display in the display panel, thereby preventing the sensing electrode 62 from being affected due to interference of other electrical signals, and avoiding affecting the sensing effect. Since the sensing electrode 62 and the effective touch line 63 are arranged in different layers, and the insulating layer 65 is provided between the sensing electrode 62 and the effective touch line 63, it is possible to prevent the plurality of third sensing line segments 622 included in the sensing electrode 62 from being connected to effective touch lines 63 that are not coupled to the sensing electrode 62 in a manufacturing process.

For example, a material of the insulating layer 65 may be at least one of silicon nitride, silicon oxide, or silicon oxynitride, which is not limited.

Considering an example in which the sensing electrode 62 is closer to the substrate layer 61 relative to the effective touch line 63, with continued reference to FIG. 11, each coupling portion 631 is coupled to the sensing electrode 62 through multiple via holes h in the insulating layer 65. A resistance at a via hole is large, and thus in a case where the sensing electrode 62 and the effective touch line 63 are coupled through multiple via holes h in the insulating layer 65, the multiple via holes are in a parallel connection relationship. In this case, when the number of the via holes increases, a total resistance at the via holes may decrease. The coupling between the sensing electrode 62 and the effective touch line 63 through the multiple via holes may ensure better conductivity of the sensing electrode 62 and the effective touch line 63, and improve connection reliability.

Figure 13:
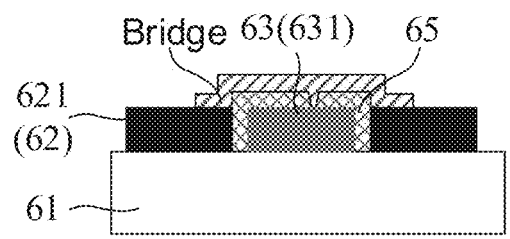
FIG. 13 is a diagram showing a structure in which an effective touch line and a sensing electrode are coupled, in accordance with some other embodiments of the present disclosure.

For another example, referring to FIG. 13, each sensing electrode 62 and at least one effective touch line 63 coupled to the sensing electrode 62 are arranged in a same layer. Each coupling portion 631 is coupled to the sensing electrode 62 through a bridge, and an insulating layer 65 is provided between the bridge and the sensing electrode 62. That is, the effective touch line 63 and the sensing electrode 62 are disposed on the substrate layer 61 and supported by the substrate layer 61. The effective touch line 63 and the sensing electrode 62 may be made of a same material and formed in a same process. Here, the effective touch line 63 and the sensing electrode 62 may be close to the substrate layer 61 relative to the bridge, or the bridge may be close to the substrate layer 61 relative to the effective touch line 63 and the sensing electrode 62. Since the effective touch line 63 and the sensing electrode 62 are arranged in the same layer, it is possible to reduce the visualization risk caused by different intensities of the reflected light due to a height difference.

For ease of description, the content of the present disclosure will be continuously described below by taking an example in which the effective touch line 63 and the sensing electrode 62 are arranged in different layers.

Figure 14:
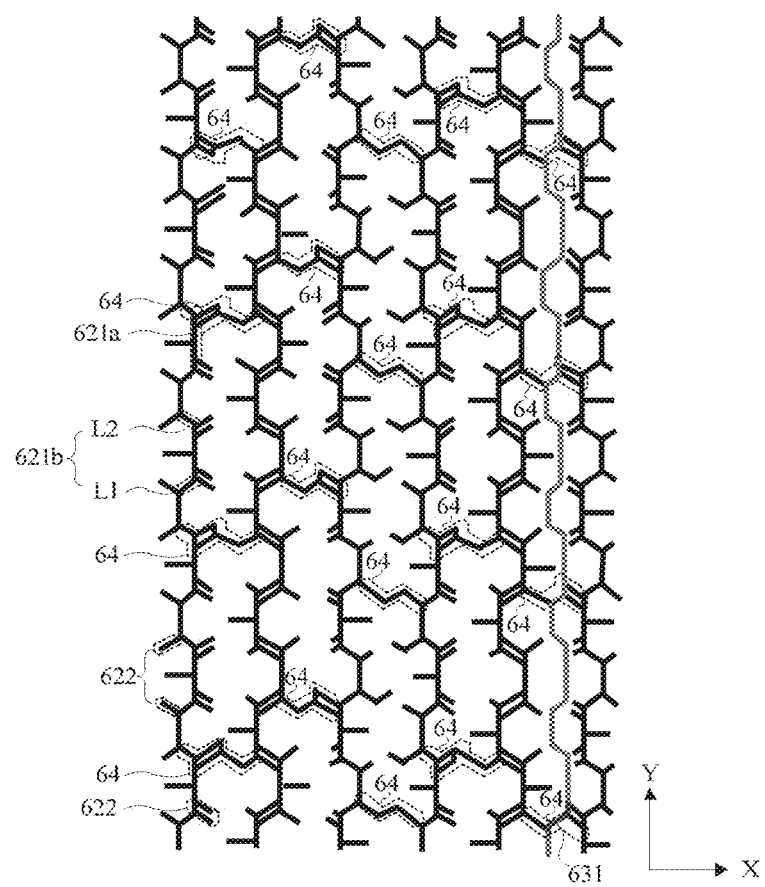
FIG. 14 is a diagram showing structures of connection portions, in accordance with some embodiments of the present disclosure.

For example, referring to FIG. 14, in at least one sensing electrode 62 (e.g., each sensing electrode 62), two adjacent sensing main lines 621 are connected through at least one connection portion 64, and each connection portion 64 is composed of at least two third sensing line segments 622 that are connected. In a case where the plurality of sensing main lines 621 in the sensing electrode 62 are independent from each other, third sensing line segments 622, which are provided with the free line ends, connected to a sensing main line 621 may increase a sensing area of the sensing main line 621. The sensing area of the sensing electrode 62 is determined by sensing main lines 621 that are coupled to the effective touch line 63. Sensing main lines 621 in the sensing electrode 62 that are not coupled to the effective touch line 63 may not perform touch sensing function. Therefore, in order to increase the sensing area of the sensing electrode 62, the plurality of sensing main lines 621 in the sensing electrode 62 need to be coupled. In this way, as long as one sensing main line 621 or one third sensing line segment 622 connected to the sensing main line 621 is coupled to the effective touch line 63, the plurality of sensing main lines 621 that are connected in the sensing electrode 62 may all be used to realize the touch sensing. Therefore, the plurality of sensing main lines 621 independent from each other in the sensing electrode 62 may be connected through a plurality of third sensing line segments 622. Third sensing line segments 622 connecting two adjacent sensing main lines 621 constitute a connection portion 64, and a plurality of connection portions 64 may be disposed between two adjacent sensing main lines 621. As a result, the plurality of sensing main lines 621 included in the sensing electrode 62 may have better conductivity, which may improve the connection reliability. For example, referring to FIG. 14, two adjacent sensing main lines 621 are connected through three or four third sensing line segments 622 disposed between the two adjacent sensing main lines 621; and four connection portions 64 are disposed between the two adjacent sensing main lines 621.

For example, referring to FIG. 14, connection portions 64 in two adjacent columns, in each of which at least one connection portion 64 is arranged, are staggered in the second direction, and the column direction is the first direction. Since the sensing main line 621 extends along the first direction, connection portions 64 for coupling a sensing main line 621 to another sensing main line 621 are also arranged in the first direction. A column of connection portions 64 is a plurality of connection portions 64 that are disposed between two sensing main lines 621. Similarly, a row of connection portions 64 is a plurality of connection portions 64 that are arranged in the second direction. In order to avoid an increased visualization risk caused by a concentrated distribution of connection portions 64, the connection portions 64 need to be uniformly distributed in the region defined by the sensing electrode 62 as much as possible. Therefore, two connection portions 64, which are arranged in the first direction, coupled to a same sensing main line 621 and located on two sides of the sensing main line 621, are separated by at least one first sensing line segment 621a, and connection portions 64 in two adjacent columns, in each of which at least one connection portion 64 is arranged, are staggered in the second direction. That is, two adjacent connection portions 64 in a plurality of connection portions 64 in a same row are separated by at least two sensing main lines 621. For example, at least two connection portions 64 are disposed between two adjacent sensing main lines 621 arranged in the second direction, and the at least two connection portions 64 are spaced apart in the first direction, and at least four first sensing line segments 621a are disposed between two adjacent connection portions 64. For example, referring to FIG. 14, four connection portions 64 are disposed between two adjacent sensing main lines 621 arranged in the direction X, the four connection portions 64 are spaced apart in the direction Y, and four first sensing line segments 621a are disposed between two adjacent connection portions 64. At least one first sensing line segment 621a is disposed between two connection portions 64 that are arranged in the direction Y, coupled to a same sensing main line 621, and located on two sides of the sensing main line 621, and two adjacent connection portions 64 in a same row are separated by two sensing main lines 621. The above arrangement may ensure that the plurality of sensing main lines 621 in the sensing electrode 62 are reliably electrically connected, and that the sensing electrode 62 has a large sensing area and a large touch sensing amount, and may also ensure that the connection portions 64 are uniformly distributed in the region defined by the sensing electrode 62, thereby minimizing the visualization risk of the connection portions 64 and ensuring the display effect to a great extent.

Figure 15:
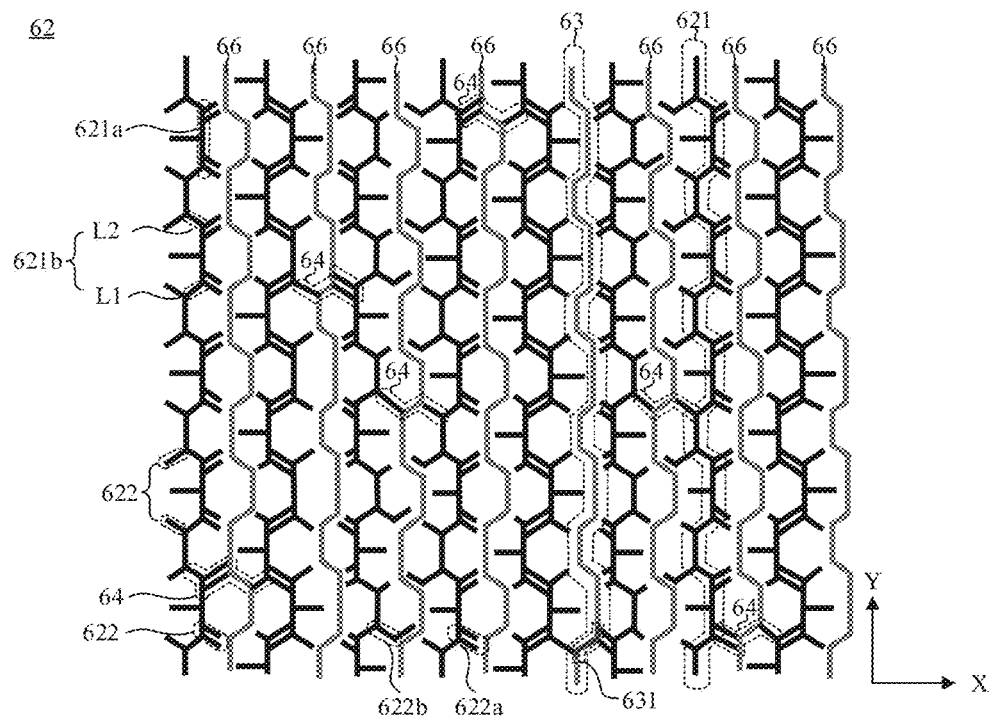
FIG. 15 is a diagram showing a structure of a sensing electrode, in accordance with some embodiments of the present disclosure.

For example, referring to FIG. 15, the touch layer assembly further includes at least one dummy touch line 66 disposed in a same layer as the plurality of effective touch lines 63. The at least one dummy touch line 66 extends along the first direction, and the at least one dummy touch line 66 is arranged in the second direction. A shape of the dummy touch line 66 and the shape of the effective touch line 63 are substantially the same. Effective touch line(s) 63 and dummy touch line(s) 66 that correspond to each of at least one sensing electrode 62 (e.g., each sensing electrode 62) are spaced apart in the second direction. That is, in the layer, a distance between any two metal lines adjacent in the second direction is equal. One of the two adjacent metal lines may be an effective touch line 63, and the other thereof is a dummy touch line 66; or, the two adjacent metal lines may be two effective touch lines 63; or, the two adjacent metal lines may be two dummy touch lines 66. Effective touch lines 63 passing through a region defined by each sensing electrode 62 may be arranged in a concentrated manner or a dispersed manner, and a size, in the second direction, of a distribution region of the effective touch lines 63 is smaller than a size, in the second direction, of the region defined by the sensing electrode 62. Therefore, referring to FIG. 15, a plurality of dummy touch lines 66 may be disposed in the same layer as the plurality of effective touch lines 63, and each dummy touch line 66 passes through sensing electrodes 62 arranged in the direction Y. Since the dummy touch line is not used to transmit a sensing signal, in some examples, the dummy touch line is not coupled to any sensing electrode 62. The shape of each dummy touch line 66 and the shape of the effective touch line 63 are substantially the same. That is, the shape of the dummy touch line 66 is similar to the shape of the effective touch line 63. In this way, it is possible to ensure that viewing angles of the dummy touch line 66 and the effective touch line 63 are the same, and addition of the dummy touch line 66 will not result in addition of a new viewing angle, and the visualization risk may not be increased. The plurality of dummy touch lines 66 and the plurality of effective touch lines 63 are disposed in the same layer, and are spaced apart. Therefore, for any effective touch line 63, dummy touch line(s) 66 adjacent thereto in the second direction may increase the number of metal lines (i.e., dummy touch lines 66 and effective touch lines 63) in the region defined by the sensing electrode 62, increase a density of the metal lines, and reduce a distance between the metal lines, so that the display of Mura caused by an excessively large distance or a concentrated arrangement of the metal lines is reduced, and the display effect is improved.

Figure 16:
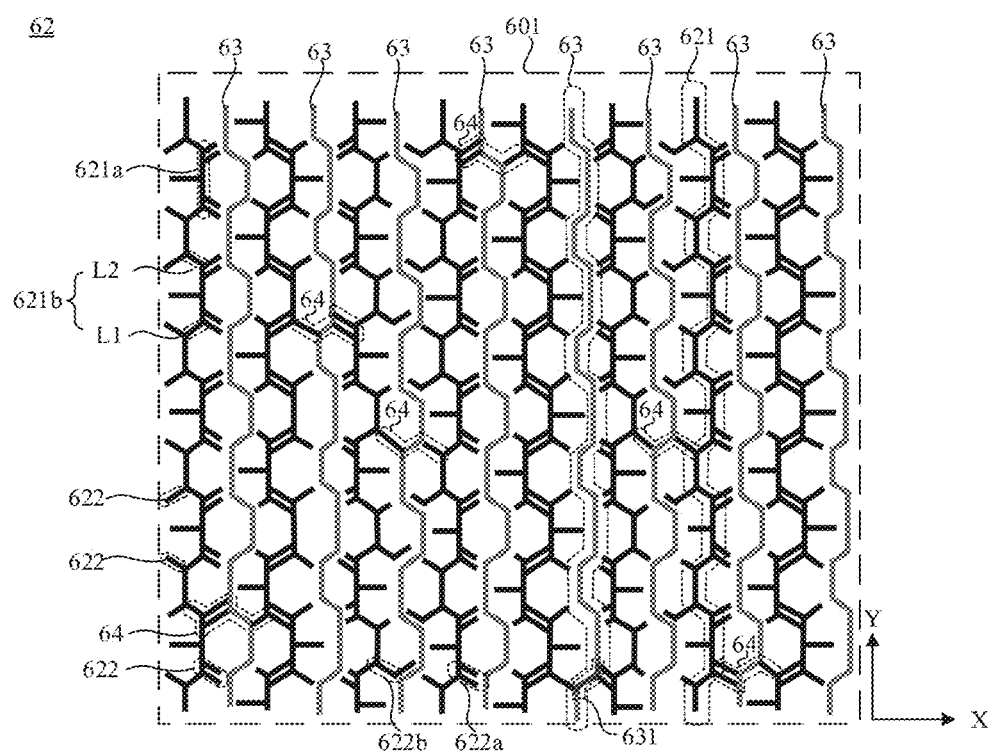
FIG. 16 is a diagram showing a structure of a sensing electrode, in accordance with some embodiments of the present disclosure.

For example, referring to FIG. 16, in the touch layer assembly, at least one sensing electrode 62 (e.g., each sensing electrode 62) has a first region 601, and effective touch lines 63 passing through the first region 601 and sensing main lines 621 located in the first region 601 are alternately arranged. That is, in the first region 601, the number of sensing main lines 621 disposed between any two adjacent effective touch lines 63 is equal. For example, referring to FIG. 16, the first region 601 is the region defined by the sensing electrode 62. In this case, the effective touch lines 63 passing through the sensing electrode 62 are distributed on the entire sensing electrode 62 in the second direction, and the number of sensing main lines 621 disposed between any two effective touch lines 63 adjacent in the direction X is equal, which is x, and x is greater than or equal to 1 (x≥1). For example, x is equal to 1 (x=1).

Figure 17:
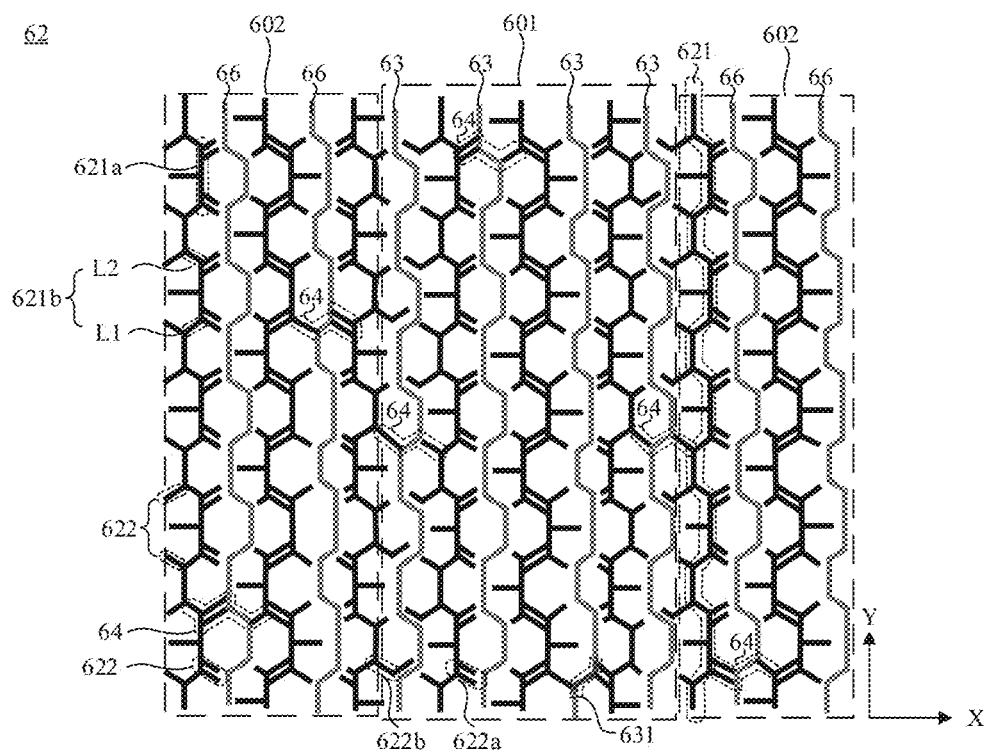
FIG. 17 is a diagram showing a structure of a sensing electrode, in accordance with some embodiments of the present disclosure.

For another example, referring to FIG. 17, the first region 601 is part of the region defined by the sensing electrode 62. In this case, at least one sensing electrode 62 (e.g., each sensing electrode 62) further has two second regions 602, and at least one dummy touch line 66 passing through the second region 602 and sensing main lines 621 located in the second region 602 are alternately arranged in the second direction. That is, in the second regions 602, the number of sensing main lines 621 disposed between any two adjacent dummy touch lines 66 is equal; and the number of sensing main lines 621 disposed between any two adjacent dummy touch lines 66 is equal to the number of sensing main lines 621 disposed between any two adjacent effective touch lines 63. The two second regions 602 are located on two sides of the first region 601 in the second direction. In this case, the effective touch lines 63 pass through the first region 601, and no effective touch line 63 passes through the second regions 602; and the dummy touch lines 66 pass through the second regions 602, and no dummy touch line 66 passes through the first region 601. The number of sensing main line 621 disposed between any two metal lines (i.e., dummy touch lines 66 and/or effective touch lines 63) adjacent in the direction X is equal, which is one. The effective touch lines 63 are arranged as centrally as possible passing through the region defined by the sensing electrode 62, so that a changing amount of a capacitance at an edge of the sensing electrode 62 that is away from the effective touch lines 63 is large, thereby achieving a better sensing effect.

Figure 18:
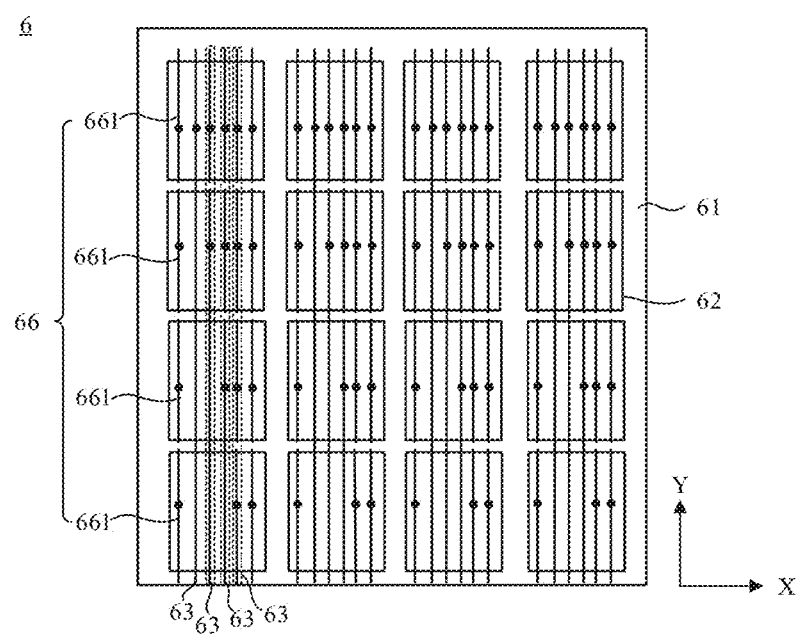
FIG. 18 is a diagram showing a structure of a touch layer assembly, in accordance with some embodiments of the present disclosure.

For example, as shown in FIG. 18, at least one dummy touch line 66 (e.g., each dummy touch line 66) includes at least one dummy touch line segment 661 (e.g., multiple dummy touch line segments 661), and each dummy touch line segment 661 is coupled to a respective sensing electrode 62. For example, referring to FIG. 18, a dummy touch line 66 passing through sensing electrodes 62 is divided into a plurality of dummy touch line segments 661 by a plurality of disconnected points, and each dummy touch line segment 661 is coupled to a sensing electrode 62 that the dummy touch line segment 661 passes through. A specific manner in which the dummy touch line segment 661 is coupled to the sensing electrode 62 is not limited. The dummy touch line segment 661 and the sensing electrode 62 may be coupled through at least one via hole (e.g., more via holes). Of course, the dummy touch line segment 661 and the sensing electrode 62 may also be coupled in other manners. In this case, the dummy touch line segment 661 is used as a part of the sensing electrode 62. The coupling between the dummy touch line segment 661 and the sensing electrode 62 may increase the area of the sensing electrode 62 and increase the touch sensing amount. Moreover, since each dummy touch line segment 661 is coupled to a respective sensing electrode 20, even if orthographic projections, on the substrate layer 61, of the dummy touch line segment 661 and the sensing electrode 62 coupled thereto have an overlapping region, no coupling capacitance is generated between the dummy touch line segment 661 and the sensing electrode 62.

For example, lengths of the plurality of effective touch lines 63 may be substantially the same or different. For example, referring to FIG. 1, each effective touch line 63 passes through a column of sensing electrodes 62 arranged in the direction Y in the display region. The lengths of the plurality of effective touch lines 63 are substantially the same, equivalent resistances thereof are also substantially the same, and impacts on voltages of sensing signals are also substantially the same, which may be equivalent to eliminating adverse effect of the lengths of the lines on the sensing signals, thereby facilitating to improve the accuracy of the sensing result. The number of effective touch lines 63 disposed in a region defined by each column of sensing electrodes 6 is not less than the number of sensing electrodes 62 in the column of sensing electrodes 62, thereby ensuring that each sensing electrode 62 is coupled to at least one effective touch line 63. In addition, the region defined by each sensing electrode 62 may further be provided with at least one dummy touch line 66 (e.g., one dummy touch line 66) disposed in the same layer as the effective touch lines 63, so as to reduce the visualization risk of the metal lines in the layer. Since each dummy touch line 66 is divided into dummy touch line segments 661 coupled to sensing electrodes 62, areas of the sensing electrodes 62 are increased.

Figure 19:
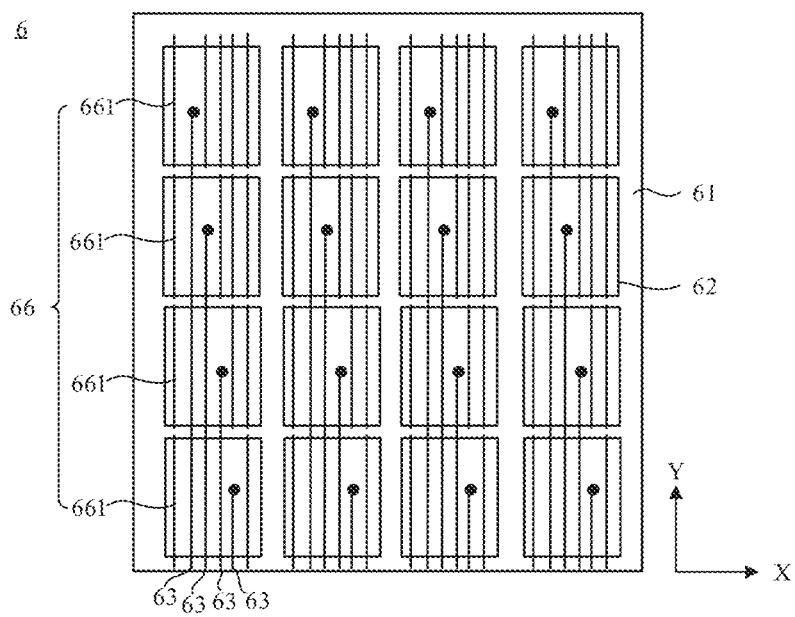
FIG. 19 is a diagram showing a structure of a touch layer assembly, in accordance with some other embodiments of the present disclosure.

For another example, referring to FIG. 19, lengths of the plurality of effective touch lines 63 are different, and the plurality of effective touch lines 63 arranged in the direction X pass through different numbers of sensing electrodes 62 in the direction Y. An end of each effective touch line 63 is located at an edge of the display region, and another end thereof is disposed in a region defined by a sensing electrode 62 coupled to the effective touch line 63. Moreover, at least one dummy touch line 66 (e.g., more dummy touch lines 66) disposed in the same layer as the effective touch lines 63 may further be provided. The lengths of the plurality of dummy touch lines 66 are different, and each dummy touch line 66 is divided into a plurality of dummy touch line segments 661 each coupled to a respective sensing electrode 62, so that the area of the sensing electrode 62 may be increased. A sum of the number of the effective touch lines 63 passing through the column of sensing electrodes 62 and the number of dummy touch line segments in the column of sensing electrodes 62 is not smaller than the number of the sensing electrodes 62 in the column of sensing electrodes 62, so that the visualization risk of the metal lines in the layer is reduced.

Figure 20:
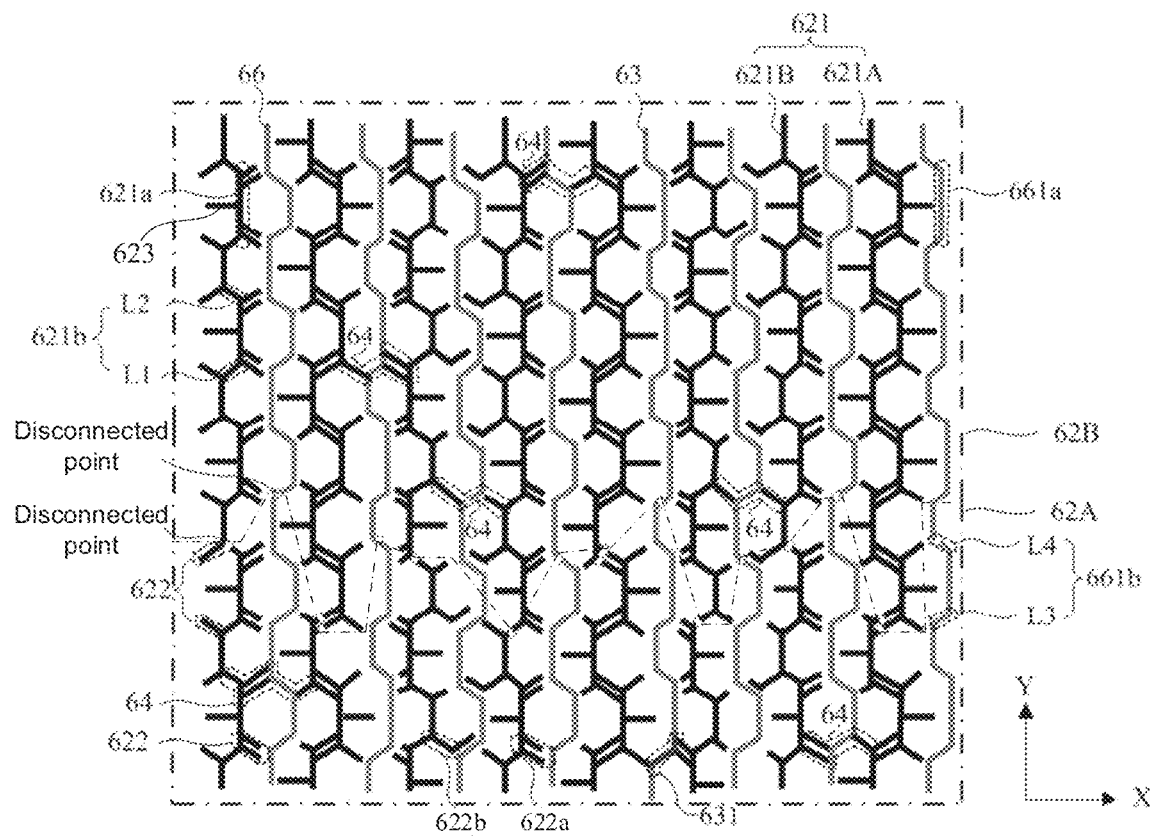
FIG. 20 is a diagram showing a structure of a sensing electrode, in accordance with some embodiments of the present disclosure.

For example, as shown in FIG. 20, each of at least one dummy touch line 66 (e.g., each dummy touch line 66) is composed of a plurality of first touch line segments 661a and a plurality of second touch line segments 661b that are alternately connected. At least one first touch line segment 661a (e.g., each first touch line segment 661a) extends along the first direction, and at least one second touch line segment 661b (e.g., each second touch line segment 661b) is oblique relative to the first direction. For example, referring to FIG. 20, the first touch line segment 661a is a straight line segment extending along the direction Y, and the second touch line segment 661b is an oblique line segment that does not extend along the direction Y. An extension direction of the second touch line segment 661b and an extension direction of the first touch line segment 661a have an included angle therebetween, and the included angle is an obtuse angle. Of course, the included angle may also be an acute angle, which is not limited.

For example, in the touch layer assembly, the plurality of second touch line segments 661b include a plurality of third oblique line segments L3 and a plurality of fourth oblique line segments L4. The plurality of third oblique line segments L3 and the plurality of four oblique line segments L4 are alternately arranged in the first direction. The third oblique line segment L3 is parallel to the first oblique line segments L1, and the fourth oblique line segment L4 is parallel to the second oblique line segments L2. That is, the third oblique line segment L3 extends in a same direction as the first oblique line segments L1, and the fourth oblique line segment L4 extends in a same direction as the second oblique line segments L2. In the first sensing electrode 62A and the second sensing electrode 62B, in a plurality of disconnected points where two dummy touch line segments 661 arranged in a same extension direction are disconnected, a part of the disconnected points are located on third oblique line segments L3, and a remaining part of the disconnected points are located on fourth oblique line segments L4. For example, referring to FIG. 20, second touch line segments 661b oblique relative to the first direction may be divided into a third oblique line segment L3 and a fourth oblique line segment L4. Oblique directions, i.e., extension directions of the third oblique line segment L3 and the fourth oblique line segment L4 are different, the third oblique line segment L3 is parallel to the first oblique line segment L1, and the fourth oblique line segment L4 is parallel to the second oblique line segment L2. Except ends of the dummy touch line segment 661, an end of each first touch line segment 661a is connected to at least one third oblique line segment L3 (e.g., one third oblique line segment L3), and another end thereof is connected to at least one fourth oblique line segment L4 (e.g., one fourth oblique line segment L4). The dummy touch line segments 661 are obtained by dividing the dummy touch line 66 by disconnected points. Since the third oblique line segment L3 is parallel to the first oblique line segment L1, and the fourth oblique line segment L4 is parallel to the second oblique line segment L2, viewing angles of the third oblique line segment L3 and the first oblique line segment L1 are the same, and viewing angles of the fourth oblique line segment L4 and the second oblique line segment L2 are the same. The disconnected points for dividing the dummy touch line 66 are dispersedly disposed on the third oblique line segments L3 and the fourth oblique line segments L4, so that only a part of disconnected points may cause visualization risk at a viewing angle, and remaining disconnected points may not affect display effect at the viewing angle. The above arrangement may increase the area of the sensing electrode 62 and the touch sensing amount, prevent the visualization risk caused by the difference in the intensities of the reflected light from being increased, and facilitates to improve the display effect.

For example, in the touch layer assembly, the disconnected points where the dummy touch line segments 661 are disconnected are alternately arranged on the third oblique line segments L3 and the fourth oblique line segments L4. Referring to FIG. 20, similar to the arrangement of the disconnected points on the sensing main lines 621, this arrangement may also make the number of disconnected points that may cause visualization risk at a viewing angle small, and the plurality of disconnected points are uniformly distributed, which may further reduce the visualization risk and facilitates to improve the display effect.

For example, an extension direction of an upper edge of a disconnected surface at a disconnected point of a second touch line segment 661b is perpendicular to the extension direction of the second touch line segment 661b. This arrangement is similar to that of the disconnected points on the sensing main lines 621, and the above effects may also be achieved, and details will not be repeated here.

Based on the above, in a case where the touch layer assembly is applied to the touch display apparatus, the effective touch lines 63 and the sensing electrodes 62 are located in the pixel defining region. That is, each effective touch line 63, and the first sensing line segments 621a, the second sensing line segments 621b, and the third sensing line segments 622 that constitute the sensing electrode 62, are disposed in the pixel defining region 101b. For example, referring to FIG. 21, orthographic projections, on the substrate layer 61, of a sensing electrode 62 and effective touch lines 63 passing through the sensing electrode 62 in the touch layer assembly form a plurality of meshes, and a sub-pixel region corresponds to a mesh. The above arrangement may prevent light emitted from the sub-pixel region 101a from being blocked by the opaque metal lines on a premise of improving the sensing effect and avoiding the display of Mura caused by the sensing electrodes 62 and the effective touch lines 63.

There are differences in luminous efficiencies, service lives and the like of sub-pixels of different colors, and thus there are also differences in shapes and sizes of the sub-pixels of different colors. For example, a sub-pixel with a low luminous efficiency may be made larger, and a sub-pixel with a high luminous efficiency may be made smaller, so as to balance luminous conditions of the sub-pixels of different colors, thereby realizing normal display. For example, referring to FIG. 21, in a case where sub-pixel regions 101a include a red sub-pixel region provided with a red sub-pixel R, a green sub-pixel region provided with a green sub-pixel G, and a blue sub-pixel region provided with a blue sub-pixel B, the green sub-pixel G has a high luminous efficiency, the blue sub-pixel B has a low luminous efficiency, and the red sub-pixel R has an intermediate luminous efficiency, so that the sizes of the sub-pixels are that a size of the blue sub-pixel B is greater than a size of the red sub-pixel R, and the size of the red sub-pixel R is greater than a size of the green sub-pixel G. Correspondingly, shapes of the sub-pixel regions 101a may also be as shown in FIG. 22; a part of sub-pixel regions 101a have a hexagonal shape, and a part of sub-pixel regions 101a have a pentagonal shape. The red sub-pixel R is disposed in a hexagonal sub-pixel region 101a, the blue sub-pixel B is disposed in a hexagonal sub-pixel region 101a, and the green sub-pixel G is disposed in a pentagonal sub-pixel region 101a. Referring to FIG. 22, a red sub-pixel R, a green sub-pixel G, and a blue sub-pixel B constitute a pixel 103, and two pixels 103 share one red sub-pixel R.

Figure 21:
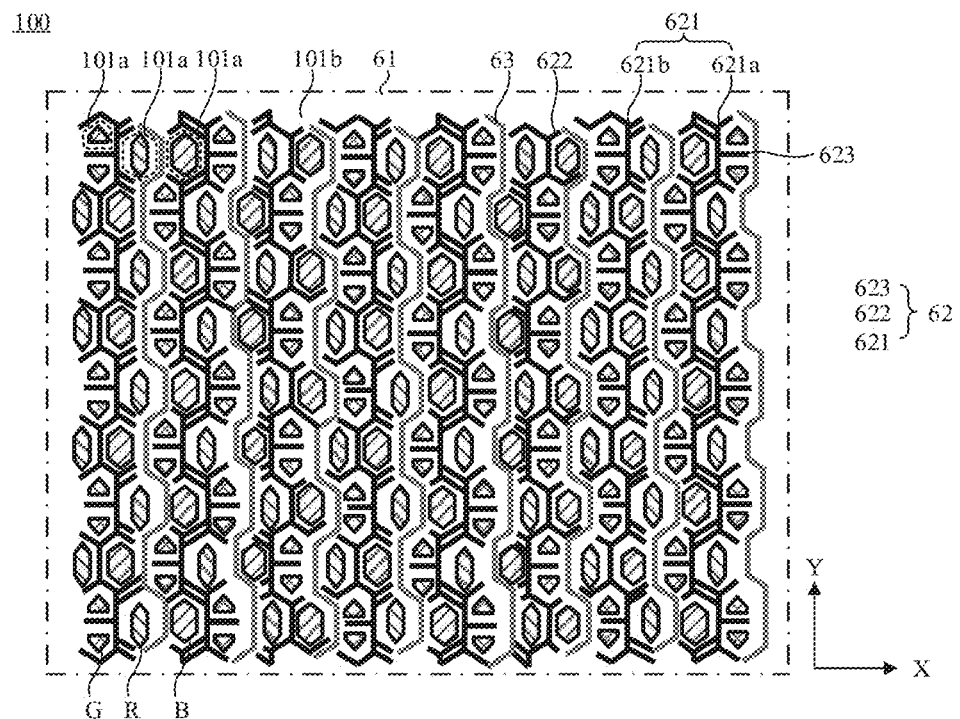
FIG. 21 is a diagram showing a structure of a touch display apparatus, in accordance with some embodiments of the present disclosure.
Figure 22:
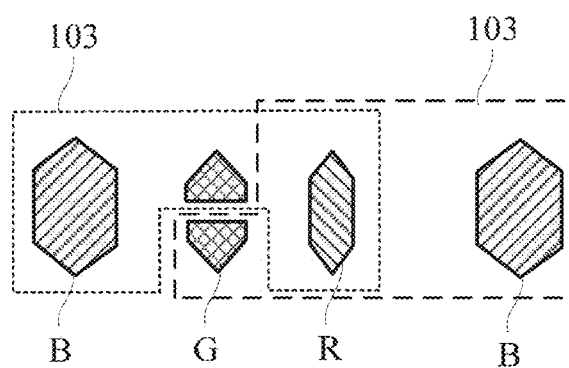
FIG. 22 is a diagram showing a structure of a pixel, in accordance with some embodiments of the present disclosure.

In this case, as shown in FIGS. 20 and 21, the touch layer assembly may further include at least one fourth sensing line segment 623 (e.g., multiple fourth sensing line segments 623), and each fourth sensing line segment 623 is perpendicular to a first sensing line segment 621a connected thereto. For example, referring to FIGS. 20 and 21, in the sensing electrode 62, the plurality of sensing main lines 621 may be divided into first sensing main lines 621A and second sensing main lines 621B. Each first sensing line segment 621a of a first sensing main line 621A is connected to a respective fourth sensing line segment 623, and fourth sensing line segments 623 connected to the first sensing main line 621A are alternately arranged on two sides of the first sensing main line 621A along the first direction. Only each of a part of first sensing line segments 621a of the second sensing main line 621B are connected to a respective fourth sensing line segment 623, and the fourth sensing line segments 623 connected to the second sensing main line 621B are located on a same side of the second sensing main line 621B. Orthographic projections, on the substrate layer 61, of the sensing electrode 62 including fourth sensing line segments 623 and effective touch lines 63 passing through the sensing electrode 62 form a plurality of meshes, and a sub-pixel region corresponds to a mesh. The above arrangement may further increase the area of the sensing electrode 62 and improve the touch sensing amount on a premise of not blocking the light emitted from the sub-pixel region 101a.

For example, in the touch display apparatus, two sensing main lines 621 adjacent in the second direction are separated by m sub-pixel regions, m is greater than or equal to 1 (m≥1), and m is a positive integer. For example, referring to FIG. 21, m is equal to 2 (m=2). The effective touch lines 63 and the sensing main lines 621 are alternately arranged in the direction X. In addition, in a case where m≥1, in combination with the avoidance design of the third sensing line segment, it is possible to minimize the overlapping regions of the orthographic projections of the sensing electrode 62 and the effective touch lines 63 on the substrate layer 61, so that the sensing area may be made as large as possible, and the effective touch lines 63 and the sensing main lines 621 may be uniformly distributed, and a risk of the display of Mura may be reduced on a premise of optimizing a wiring way.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A touch layer assembly, comprising:
   a substrate layer;
   a plurality of effective touch lines disposed on the substrate layer, at least one effective touch line extending along a first direction, the plurality of effective touch lines being arranged in a second direction intersecting the first direction; and
   a plurality of sensing electrodes disposed on the substrate layer, a sensing electrode being coupled to at least one effective touch line, wherein
   the sensing electrode includes a plurality of sensing main lines arranged in the second direction; at least one sensing main line extends along the first direction, and each of at least one sensing main line is composed of a plurality of first sensing line segments and a plurality of second sensing line segments that are alternately connected; at least one first sensing line segment extends along the first direction, and at least one second sensing line segment is oblique relative to the first direction;
   the sensing electrode further includes a plurality of third sensing line segments connected to a sensing main line; at least one third sensing line segment is oblique relative to the first direction, and the at least one third sensing line segment has a free line end;
   the plurality of sensing electrodes include a first sensing electrode and a second sensing electrode that are adjacent in the first direction; and in the first sensing electrode and the second sensing electrode, a disconnected point where two sensing main lines adjacent in a same extension direction are disconnected is located on a second sensing line segment at an end of a sensing main line of the two sensing main lines.

2. The touch layer assembly according to claim 1, wherein
   the at least one third sensing line segment extends in a same direction as a second sensing line segment;
   the at least one effective touch line includes at least one coupling portion, and each coupling portion is electrically connected to the sensing electrode; an orthographic projection, on the substrate layer, of a portion of each effective touch line of the at least one effective touch line other than at least one coupling portion included in the effective touch line is not overlapped with an orthographic projection, on the substrate layer, of the sensing electrode.

3. The touch layer assembly according to claim 2, wherein
   the plurality of second sensing line segments include a plurality of first oblique line segments and a plurality of second oblique line segments; an angle from the first direction clockwise to an extension direction of a first oblique line segment is an acute angle, and an angle from the first direction clockwise to an extension direction of a second oblique line segment is an obtuse angle; and
   in a plurality of disconnected points where the first sensing electrode and the second sensing electrode are disconnected, a part of the disconnected points are located on first oblique line segments in the first sensing electrode and the second sensing electrode, and a remaining part of the disconnected points are located on second oblique line segments in the first sensing electrode and the second sensing electrode.

4. The touch layer assembly according to claim 3, wherein in the second direction, the plurality of disconnected points where the first sensing electrode and the second sensing electrode are disconnected are alternately distributed on the first oblique line segments and the second oblique line segments.

5. The touch layer assembly according to claim 2, wherein the sensing electrode and the at least one effective touch line coupled to the sensing electrode are arranged in different layers; the touch layer assembly further comprises an insulating layer disposed between the sensing electrode and the effective touch line; and the coupling portion is coupled to the sensing electrode through at least one via hole in the insulating layer, or
   the sensing electrode and the at least one effective touch line coupled to the sensing electrode are arranged in a same layer, the coupling portion is coupled to the sensing electrode through a bridge, and an insulating layer is provided between the bridge and the sensing electrode.

6. The touch layer assembly according to claim 1, wherein
   the plurality of sensing electrodes further include a third sensing electrode adjacent to the first sensing electrode in the second direction;
   an edge sensing main line at a border between the first sensing electrode and the third sensing electrode is provided with at least one disconnected point, and the at least one disconnected point divides the edge sensing main line into a plurality of disconnected lines; and at least one disconnected line in the plurality of disconnected lines that is not connected to the first sensing electrode is connected to the third sensing electrode.

7. The touch layer assembly according to claim 6, wherein the at least one disconnected point of the edge sensing main line is located on at least one second sensing line segment of the edge sensing main line.

8. The touch layer assembly according to claim 1, wherein an extension direction of an upper edge of a disconnected surface at the disconnected point of the second sensing line segment is perpendicular to an extension direction of the second sensing line segment, and the upper edge is an edge, away from the substrate layer, of edges of the disconnected surface.

9. The touch layer assembly according to claim 1, wherein in the sensing electrode, two adjacent sensing main lines are connected through at least one connection portion, and a connection portion is composed of at least two third sensing line segments that are connected.

10. The touch layer assembly according to claim 9, wherein a plurality of connection portions in two adjacent columns are staggered in the second direction, and a direction in which a column of the connection portions are arranged is the first direction; or a plurality of connection portions in two adjacent columns are staggered in the second direction, and a direction in which a column of the connection portions are arranged is the first direction; at least two connection portions are disposed between two adjacent sensing main lines that are arranged in the second direction; and at least four first sensing line segments are disposed between two adjacent connection portions in the at least two connection portions.

11. The touch layer assembly according to claim 1, further comprising:

a plurality of dummy touch lines disposed in a same layer as the plurality of effective touch lines, wherein at least one dummy touch line extends along the first direction, the at least one dummy touch line is arranged in the second direction, and a shape of a dummy touch line and a shape of an effective touch line are substantially same;

at least one effective touch line and at least one dummy touch line that correspond to the sensing electrode are spaced apart in the second direction.

12. The touch layer assembly according to claim 11, wherein the at least one sensing electrode has a first region, and effective touch lines passing through the first region and sensing main lines located in the first region are alternately arranged in the second direction;

the at least one sensing electrode further has two second regions, and at least one dummy touch line passing through a second region and sensing main lines located in the second region are alternately arranged in the second direction; and the two second regions are located on two sides of the first region in the second direction.

13. The touch layer assembly according to claim 11, wherein the dummy touch line includes at least one dummy touch line segment; and a dummy touch line segment is coupled to a sensing electrode.

14. The touch layer assembly according to claim 13, wherein each of the at least one dummy touch line is composed of a plurality of first touch line segments and a plurality of second touch line segments that are alternately connected; at least one first touch line segment extends along the first direction, and at least one second touch line segment is oblique relative to the first direction;

the plurality of second touch line segments include a plurality of third oblique line segments and a plurality of fourth oblique line segments; the plurality of third oblique line segments and the plurality of four oblique line segments are alternately arranged in the first direction;

a third oblique line segment extends in a same direction as a first oblique line segment;

a fourth oblique line segment to extends in a same direction as a second oblique line segment;

in the first sensing electrode and the second sensing electrode, in a plurality of disconnected points where two dummy touch line segments adjacent in a same direction are disconnected, a part of the disconnected points are located on third oblique line segments, and a remaining part of the disconnected points are located on fourth oblique line segments.

15. The touch layer assembly according to claim 14, wherein in the second direction, the plurality of disconnected points where the plurality of dummy touch line segments are disconnected are alternately located on the third oblique line segments and the fourth oblique line segments, and/or an extension direction of an upper edge of a disconnected surface at a disconnected point of a second touch line segment is perpendicular to an extension direction of the second touch line segment, and the upper edge is an edge, away from the substrate layer, of edges of the disconnected surface.

16. The touch layer assembly according to claim 1, further comprising at least one fourth sensing line segment, a fourth sensing line segment being perpendicular to a first sensing line segment connected thereto.

17. A touch display apparatus, comprising the touch layer assembly according to claim 1.

18. The touch display apparatus according to claim 17, wherein the touch display apparatus has a display region; the display region includes a plurality of sub-pixel regions and a pixel defining region for defining the plurality of sub-pixel regions; and the effective touch lines and the sensing electrodes are located in the pixel defining region.

19. The touch display apparatus according to claim 18, wherein two sensing main lines adjacent in the second direction are separated by m sub-pixel regions, m is greater than or equal to 1, and m is a positive integer.

20. The touch display apparatus according to claim 5, wherein the touch display apparatus is a self-luminescent display apparatus; the self-luminescent display apparatus includes a display substrate; and the substrate layer in the touch layer assembly servers as an encapsulation layer for encapsulating the display substrate.

* * * * *

UNITED STATES PATENT AND TRADEMARK OFFICE
CERTIFICATE OF CORRECTION

| | | |
|---|---|---|
| PATENT NO. | : 12,067,190 B1 | Page 1 of 1 |
| APPLICATION NO. | : 17/778470 | |
| DATED | : August 20, 2024 | |
| INVENTOR(S) | : Zewen Bo, Xuefei Sun and Yuanyuan Li | |

It is certified that error appears in the above-identified patent and that said Letters Patent is hereby corrected as shown below:

In the Claims

Column 30 (Claim 20), Line 55: "The touch display apparatus according to claim 5" should be "The touch display apparatus according to claim 17".

Signed and Sealed this
Fourth Day of March, 2025

Coke Morgan Stewart
*Acting Director of the United States Patent and Trademark Office*